US010810911B2

(12) United States Patent
Yamazaki

(10) Patent No.: US 10,810,911 B2
(45) Date of Patent: Oct. 20, 2020

(54) MOLDED ARTICLE, DISPLAY DEVICE INCLUDING THE MOLDED ARTICLE, AND METHOD FOR MANUFACTURING MOLDED ARTICLE

(71) Applicant: NISSHA CO., LTD., Kyoto-shi, Kyoto (JP)

(72) Inventor: Seiichi Yamazaki, Kyoto (JP)

(73) Assignee: NISSHA CO., LTD., Kyoto-Shi, Kyoto (JP)

( * ) Notice: Subject to any disclaimer, the term of this patent is extended or adjusted under 35 U.S.C. 154(b) by 0 days.

(21) Appl. No.: 16/643,667

(22) PCT Filed: Sep. 27, 2018

(86) PCT No.: PCT/JP2018/036108
§ 371 (c)(1),
(2) Date: Mar. 2, 2020

(87) PCT Pub. No.: WO2019/077965
PCT Pub. Date: Apr. 25, 2019

(65) Prior Publication Data
US 2020/0273384 A1    Aug. 27, 2020

(30) Foreign Application Priority Data

Oct. 16, 2017   (JP) ................. 2017-200357

(51) Int. Cl.
*G09F 13/04*        (2006.01)
*B29C 45/14*        (2006.01)
(Continued)

(52) U.S. Cl.
CPC .......... *G09F 13/0413* (2013.01); *B29C 45/14* (2013.01); *B29C 45/1671* (2013.01);
(Continued)

(58) Field of Classification Search
CPC ................. G09F 13/0413; B29C 45/14; B29C 45/14008; B29C 45/16; B29C 45/1601;
(Continued)

(56) References Cited

U.S. PATENT DOCUMENTS

2010/0159183 A1*   6/2010   Nishimura ........ B29C 45/14639
                                                                    428/77
2012/0249452 A1*  10/2012   Kitano ................... G06F 1/1656
                                                                    345/173

FOREIGN PATENT DOCUMENTS

JP    H06134805 A    5/1994
JP    H10268812 A   10/1998
(Continued)

*Primary Examiner* — Xuemei Zheng
(74) *Attorney, Agent, or Firm* — Alleman Hall Creasman & Tuttle LLP

(57) ABSTRACT

Light leakage from integrally molding a decorative sheet and a connector insert is prevented. A molded article includes a display portion through which light can pass. A molded article body of the molded article includes a second molded portion made of a light-transmitting resin transmitting light guided to the display portion and a first molded portion made of an opaque resin having lower light transmittance than the second molded portion. A decorative sheet is integrally molded with the molded article body and includes a decorative portion that embellishes the display portion. A light-transmitting touch sensor sheet is integrally molded with the molded article body and transmits light that passes through the display portion. The molded article body includes a shade structure that is at least partly disposed around an outer peripheral edge of the decorative sheet and suppresses light passing through the light-transmitting resin.

11 Claims, 32 Drawing Sheets

(51) Int. Cl.
  *B29C 45/16* (2006.01)
  *G06F 3/041* (2006.01)
  *H01L 25/075* (2006.01)
  *H01L 33/48* (2010.01)
  *H01L 33/58* (2010.01)
  *G09F 13/00* (2006.01)
  *G09F 13/10* (2006.01)
  *B29L 31/34* (2006.01)
  *G06F 3/044* (2006.01)
  *G09G 3/32* (2016.01)

(52) U.S. Cl.
  CPC .......... *G06F 3/0412* (2013.01); *G09F 13/005* (2013.01); *G09F 13/10* (2013.01); *H01L 25/0753* (2013.01); *H01L 33/486* (2013.01); *H01L 33/58* (2013.01); *B29K 2995/0026* (2013.01); *B29L 2031/3475* (2013.01); *G06F 3/044* (2013.01); *G06F 2203/04103* (2013.01); *G09F 2013/0418* (2013.01); *G09G 3/32* (2013.01); *H01L 2933/0058* (2013.01)

(58) Field of Classification Search
  CPC ............ B29C 45/1615; B29C 45/1642; B29C 45/1657; B29C 45/17
  See application file for complete search history.

(56) References Cited

FOREIGN PATENT DOCUMENTS

| | | |
|---|---|---|
| JP | 2010110927 A | 5/2010 |
| JP | 2012121159 A | 6/2012 |
| JP | 2012206465 A | 10/2012 |
| JP | 2016509965 A | 4/2016 |
| WO | 9813980 A1 | 4/1998 |
| WO | 2006095781 A1 | 9/2006 |
| WO | 2008035736 A1 | 3/2008 |
| WO | 2008149789 A1 | 12/2008 |

* cited by examiner

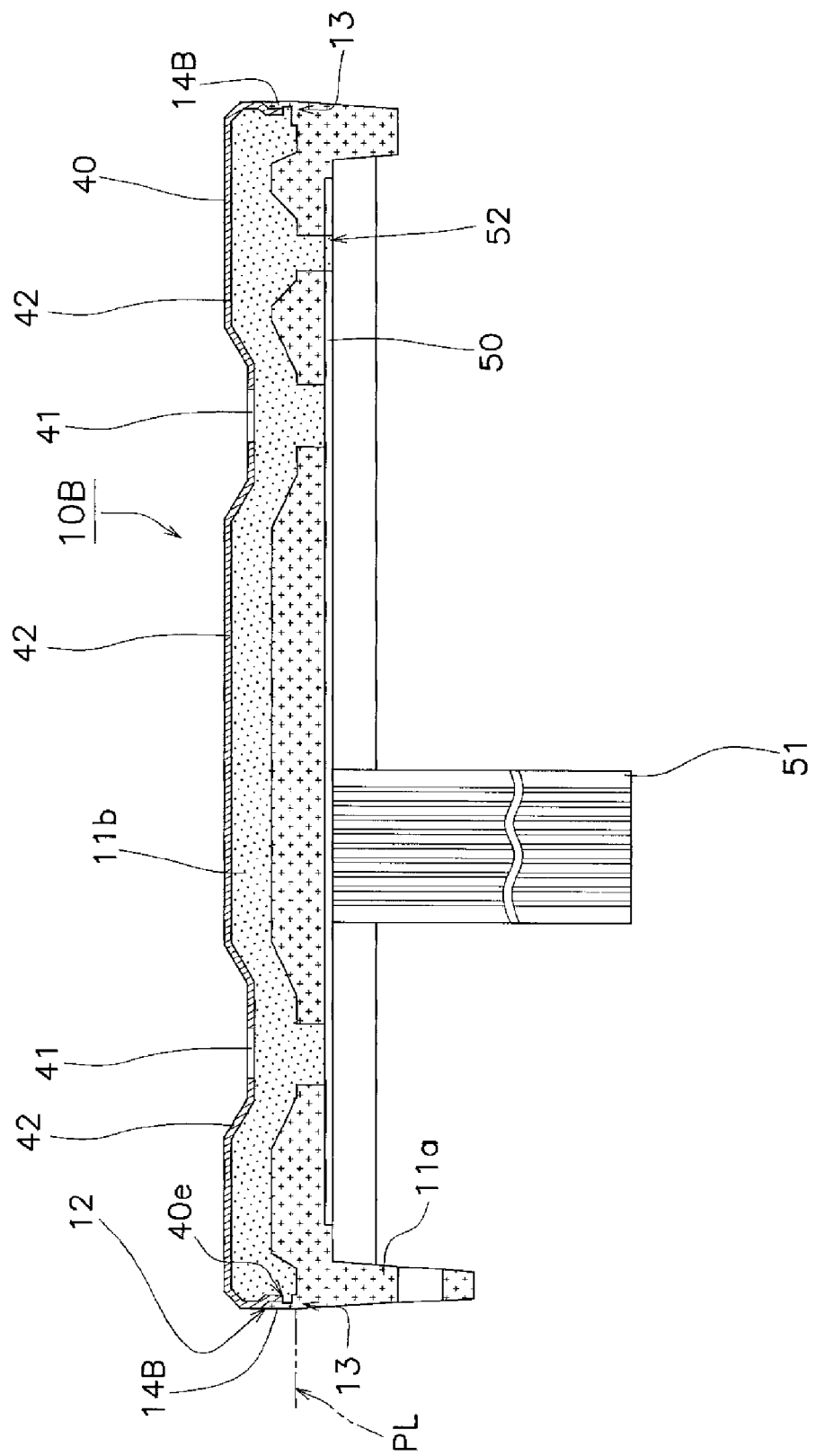

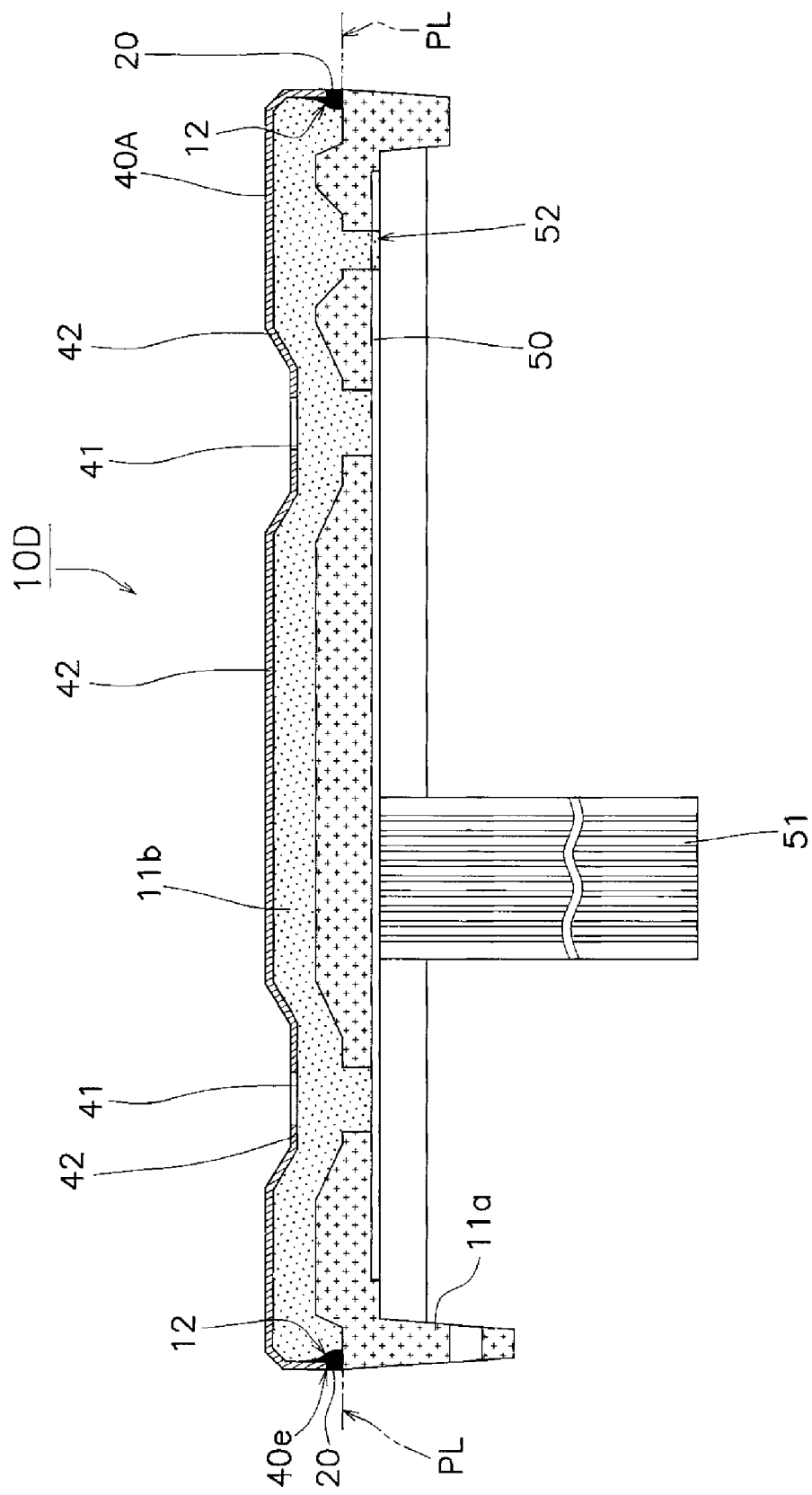

MOLDED ARTICLE, DISPLAY DEVICE INCLUDING THE MOLDED ARTICLE, AND METHOD FOR MANUFACTURING MOLDED ARTICLE

CROSS REFERENCES TO RELATED APPLICATIONS

This application is a national phase application of International Application No. PCT/JP2018/036108, filed on Sep. 27, 2018, which in turn claims priority to Japanese Patent Application 2017-200357, filed on Oct. 16, 2017, the entire disclosure of each of which are incorporated herein by reference.

TECHNICAL FIELD

The present disclosure relates to a molded article formed by integrally molding a decorative sheet and a touch sensor sheet, a display device including the molded article, and a method for manufacturing the molded article.

BACKGROUND

In a related art, a display device including a molded article having a display portion through which light can pass is known. For example, Patent Document 1 (JP 2008-210528 A) discloses a housing with an illuminated switch, the housing including a housing made of a light-transmissive material, a decorative layer that displays a light transmissive pattern and a light shielding pattern, and an electrically conductive thin film.

CITATION LIST

Patent Literature

Patent Document 1: JP 2008-210528 A

SUMMARY

Technical Problem

When forming a molded article by integrally molding a decorative sheet and a touch sensor sheet on the basis of, for example, injection molding, light may leak from near an end portion of the decorative sheet to outside the molded article due to, for instance, misalignment of the decorative sheet set in a mold.

An object of the present disclosure is to suppress light leakage from a molded article formed by integrally molding a decorative sheet and a touch sensor sheet.

Solution to Problem

Some aspects are described below as means to solve the problems. These aspects can be combined optionally, as needed.

A molded article according to one aspect of this disclosure is a molded article with a display portion through which light can pass, the molded article including: a molded article body including a first molded portion comprising an injection molded resin and a second molded portion comprising an injection molded resin, the second molded portion being made of a light-transmitting resin transmitting light guided to the display portion, and the first molded portion made of an opaque resin having a lower light transmittance than the second molded portion; a decorative sheet integrally molded with the molded article body and including a decorative portion that embellishes the display portion; and a light-transmitting touch sensor sheet integrally molded with the molded article body and transmitting light that passes through the display portion, the molded article body further including a shade structure that is at least disposed partly around a periphery of an outer peripheral edge of the decorative sheet and suppresses the light passing through the light-transmitting resin.

In the molded article, the shade structure may be provided in or around a gap between a parting line of the second molded portion and the outer peripheral edge of the decorative sheet.

In the molded article, the molded article body may include a partial region, where the second molded portion is sandwiched between the decorative sheet and the touch sensor sheet, and filled with a light-transmitting resin, and at least one of the decorative sheet and the touch sensor sheet may include a resin introduction hole that is continuous with the partial region due to the light-transmitting resin.

In the molded article, the shade structure may be a rib that is erected to a position higher than the outer peripheral edge of the decorative sheet on a peripheral edge portion of the first molded portion.

In the molded article, the rib may be inclined toward a direction in which the gap is present, and may be in contact with the decorative sheet on a peripheral edge of the gap.

In the molded article, the shade structure may be formed by mixing ink with the light-transmitting resin in or around the gap.

In the molded article, the shade structure may be the first molded portion formed into a band shape and embedded into the gap, and the first molded portion may be made of the opaque resin having the lower light transmittance than the second molded portion.

A display device according to one aspect of this disclosure includes the above-described molded article; a control device connected to the touch sensor sheet; and a light emitting element that irradiates light to the molded article.

A method for manufacturing a molded article according to one aspect of this disclosure is a method for manufacturing a molded article formed by integrally molding: a molded article body including a first molded portion portion comprising an injection molded resin and a second molded portion comprising an injection molded resin, the second molded portion being made of a light-transmitting resin transmitting light guided to the display portion, and the first molded portion being made of an opaque resin having a lower light transmittance than the second molded portion; a decorative sheet including a decorative portion that embellishes the display portion; and a light-transmitting touch sensor sheet transmitting the light that passes through the display portion, the method including forming a shade structure for suppressing the light that passes through the light-transmitting resin at least partly around an outer peripheral edge of the decorative sheet in the molded article body when insert-molding the molded article body and the decorative sheet.

Advantageous Effects of Disclosure

According to the molded article, display device, or method for manufacturing a molded article according to this disclosure, it is possible to suppress light leakage from a molded article formed by integrally molding a decorative sheet and a touch sensor sheet.

BRIEF DESCRIPTION OF DRAWINGS

FIG. 8A is a cross-sectional view illustrating an example of a molded article according to a second embodiment.

FIG. 10A is a cross-sectional view of a molded article according to a third embodiment.

DETAILED DESCRIPTION

First Embodiment

(1) Overall Configuration

Figure 1:
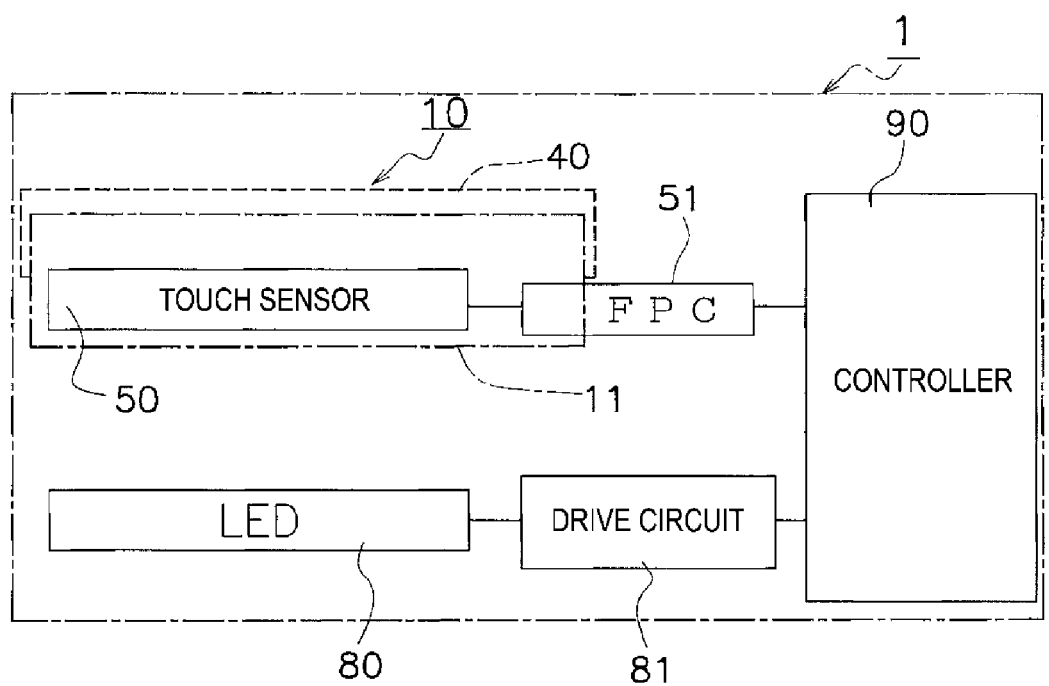
FIG. 1 is a block diagram illustrating an example of a display device according to the present disclosure.

A display device according to a first embodiment of this disclosure is described below with reference to the drawings. In FIG. 1, each component constituting a display device 1 is illustrated as a block. The display device 1 includes a molded article 10, a light emitting diode (LED) 80, a drive circuit 81, and a controller 90. The molded article 10 includes a molded article body 11, a decorative sheet 40, a touch sensor sheet 50, and a flexible printed circuit board (FPC) 51. The drive circuit 81 is an electrical circuit that causes the LED 80 to emit light. The drive circuit 81 is controlled by the controller 90. Therefore, the controller 90 controls the emission of light by the LED 80.

The decorative sheet 40, the touch sensor sheet 50, and the FPC 51 are integrally molded with the molded article body 11. As described later, for example, the decorative sheet 40, the touch sensor sheet 50, and the FPC 51 are attached to the molded article 10 on the basis of insert molding (also referred to as "in-molding") in which the decorative sheet 40, the touch sensor sheet 50, and the FPC 51 are set in a mold prior to injecting molten resin into the mold. The touch sensor sheet 50 is electrically connected to an external device by the FPC 51. In the display device 1 illustrated in FIG. 1, the touch sensor sheet 50 is connected to the controller 90 by the FPC 51. Therefore, a contact portion of the FPC 51, which is connected to the external device, is exposed to the outside of the molded article 10.

(1-1) Relationship Between Molded Article 10 and LED 80

Figure 2:
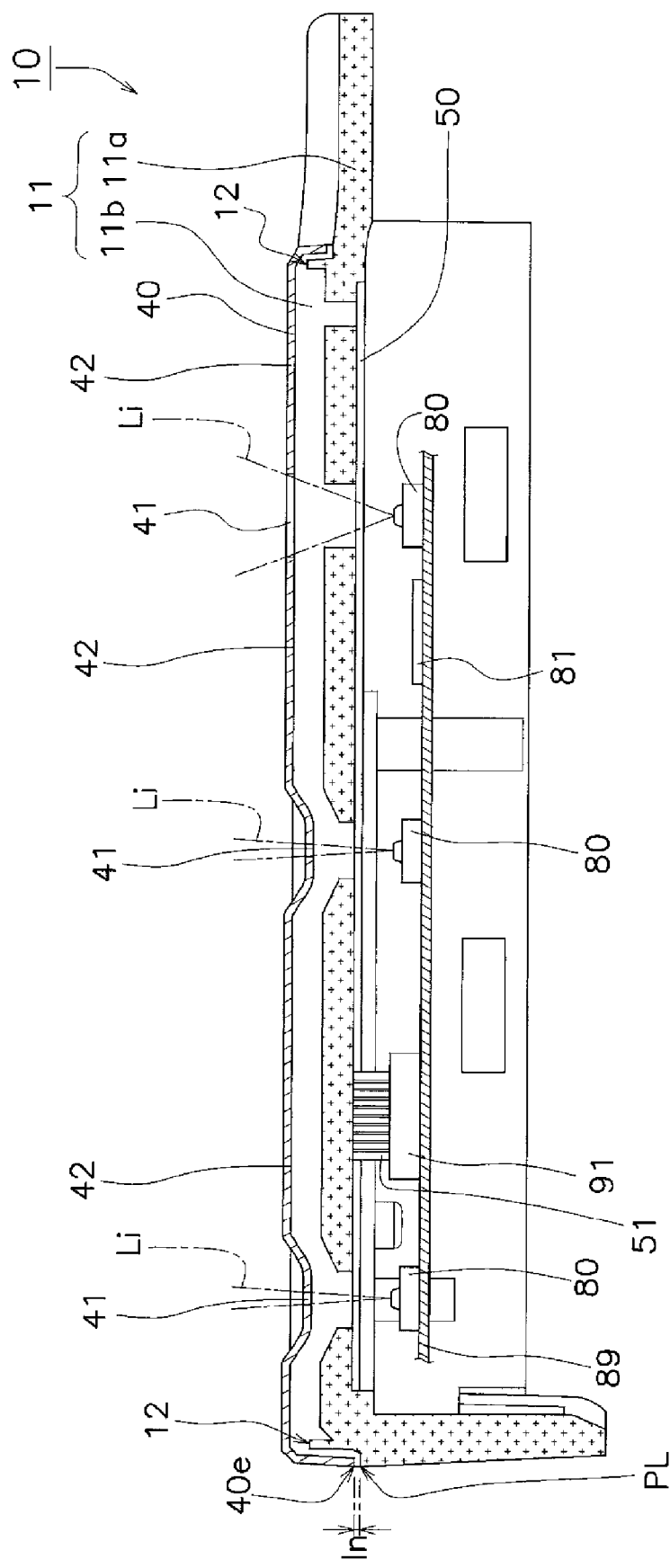
FIG. 2 is a cross-sectional view illustrating an example of a molded article and a light emitting diode (LED) according to a first embodiment.

The LED 80 and a cross-sectional structure of the molded article 10 are illustrated in FIG. 2. The LED 80 is mounted on a rigid printed circuit board 89. The drive circuit 81 that drives the LED 80 is mounted, as an integrated circuit, on the printed circuit board 89. A connector 91 that is electrically connected to the FPC 51 extending from the touch sensor sheet 50 is also mounted on the printed circuit board 89. Although not shown in FIG. 2, the connector 91 is connected to the controller 90.

The decorative sheet 40 is disposed on a top surface of the molded article body 11. The decorative sheet 40 is formed with a display portion 41 that can transmit light. The touch sensor sheet 50 is disposed on a bottom surface of the molded article body 11. In the touch sensor sheet 50, a transparent electrode is disposed at a position where, for example, at least light emitted by the LED 80 is transmitted. With this structure, the touch sensor sheet 50 can transmit light and input information in accordance with a change in capacitance due to a finger or the like approaching the touch sensor sheet 50.

The molded article body 11 includes a second molded portion 11b made of a light-transmitting resin and a first molded portion 11a made of an opaque resin. Here, the wording "light-transmitting resin" refers to a concept that includes a transparent resin and a translucent resin. The wording "opaque resin" refers to a concept that includes both a resin that is opaque due to inherently having a color and a resin that is opaque due to being colored with a pigment or the like. Further, the wording "opaque resin" refers to a concept that includes a resin having a lower transmittance of light Li irradiated from the LED 80 than a light-transmitting resin, and also a resin that does not have a function of completely blocking light. The second molded portion 11b and the first molded portion 11a have, in addition to functions of forming the shape of the molded article body 11, functions relating to the light irradiated from the LED 80. In FIG. 2, the area surrounded by a dashed dotted line indicates the light Li irradiated from the LED 80.

The second molded portion 11b is disposed such that the light Li irradiated from the LED 80 can pass through the second molded portion 11b and be guided to the display portion 41 in the decorative sheet 40. More specifically, the light-transmitting resin forming the second molded portion 11b fills a gap between the display portion 41 and the transparent electrode in the touch sensor sheet 50 above the LED 80. In other words, a region in the molded article body 11 below the display portion 41 is a region where the second molded portion 11b is sandwiched between the decorative sheet 40 and the touch sensor sheet 50 and filled with the light-transmitting resin.

The first molded portion 11a is disposed so as to suppress leakage of excess light in order to enhance the display effect of the light Li emitted from the LED 80. To this end, the opaque resin forming the first molded portion 11a preferably has light blocking properties. For example, the opaque resin is colored black. However, when, for example, light is to be leaked at a lower luminous intensity than that of the second molded portion 11b in order to enhance the decorative effect of the molded article, the first molded portion 11a may not completely block light and may be partially colored so as to be translucent. In other words, the first molded portion 11a need only have the lower light transmittance than the second molded portion.

The light Li irradiated from the LED 80 passes through the touch sensor sheet 50 and the second molded portion 11b in this order. Then, the light Li is transmitted through the display portion 41 of the decorative sheet 40 and emitted toward above the molded article body 11. The periphery of the display portion 41 is shielded from light by a decorative portion 42, for example, a graphic layer on the decorative sheet 40. The molded article 10 is configured such that excess light does not leak from portions other than the display portion 41.

(1-2) Measures Against Light Leakage

Figure 3:
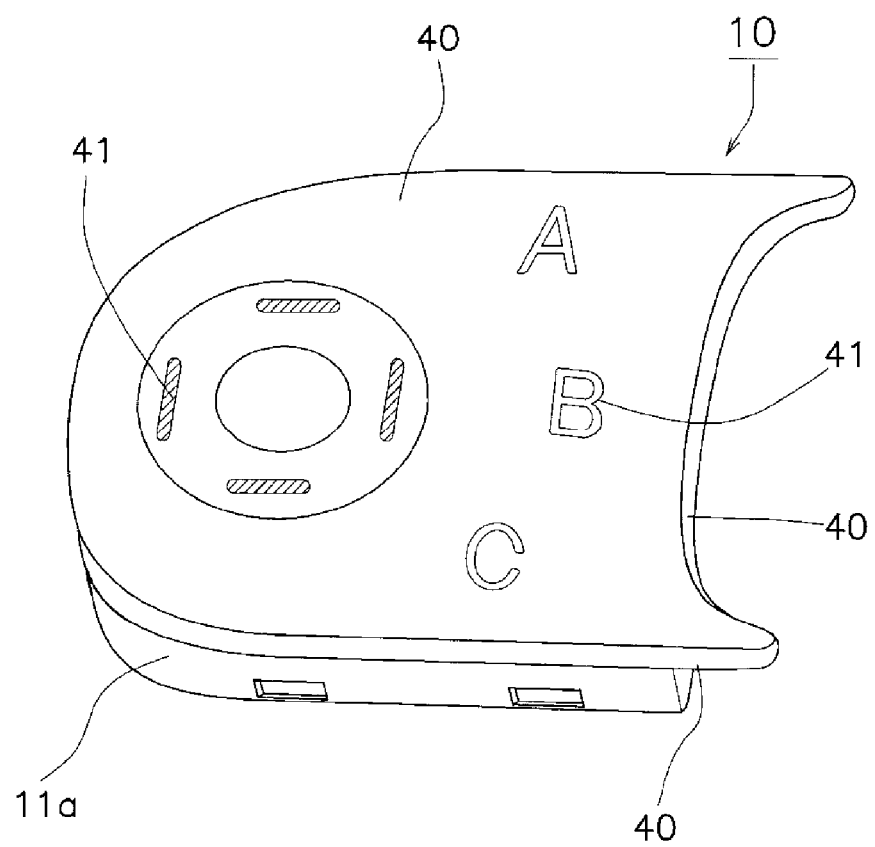
FIG. 3 is a perspective view illustrating an example of the molded article according to the first embodiment.

Some of the light Li incident on the second molded portion 11b may travel in a direction other than toward the display portion 41 due to, for instance, being reflected inside the second molded portion 11b. In order to prevent this, side surfaces of the second molded portion 11b are also covered with the decorative portion 42 of the decorative sheet 40. In addition, the front surface of the second molded portion 11b is covered with the decorative sheet 40, except at a portion not in contact with the first molded portion 11a and a portion where the light Li enters from the LED 80. FIG. 3 illustrates a state where the molded article 10 is viewed obliquely from above.

Herein, an example is described in which portions of the second molded portion 11b that are not in contact with the first molded portion 11a are covered by the decorative sheet 40, but not all portions of the second molded portion 11b that are not in contact with the first molded portion 11a need to be covered by the decorative sheet 40. When, for example, the molded article 10 is linked to another component and shielded from light by that component, the second molded portion 11b may not be covered by the decorative sheet 40 up to the portion shielded from light by the other component, and the light-transmitting resin that forms the second molded portion 11b may be exposed at a location where the molded article 10 comes into contact with the other component.

As described below, the second molded portion 11b and the first molded portion 11a are injection molded by, for example, multi-color molding (or multi-material injection molding) using a plurality of sets of molds. The decorative sheet 40 is set in a mold (for example, a second fixed platen 120 illustrated in FIG. 5C) for molding the second molded portion 11b that is to be molded later. Due to adoption of such a manufacturing process, a gap In can be formed between a parting line PL of the second molded portion 11b and an outer peripheral edge 40e of the decorative sheet 40. When this gap In is not provided, the outer peripheral edge 40e of the decorative sheet 40 comes into contact with the first molded portion 11a or the parting surface of the mold and cannot be correctly set on the decorative sheet 40 due to misalignment during manufacture. As a result, the decorative sheet 40 integrated with the molded article 10 wrinkles or other faults occur. The gap In between the parting line PL and the outer peripheral edge 40e of the decorative sheet 40 is, for example, from 0.05 mm to 0.7 mm.

The gap In provided to achieve satisfactory manufacturing is likely to be at a location where the light Li leaks from the molded article 10. Therefore, in order to suppress light leakage from the gap In, a shade structure 12 is disposed in or around the gap In inside the molded article body 11. In other words, the shade structure 12 is provided inside the molded article body 11 at least partially around the outer peripheral edge 40e of the decorative sheet 40. The light Li that has passed through the second molded portion 11b is attenuated or completely blocked by the shade structure 12. Therefore, by providing the shade structure 12, light Li that is stronger than necessary can be prevented from leaking out from the molded article 10 from the gap In. Because the shade structure 12 is part of the structure in the molded article body 11, the light suppressing function is less likely to be adversely affected due to damage or breakage.

(1-3) Shade Structure 12

Figure 4A:
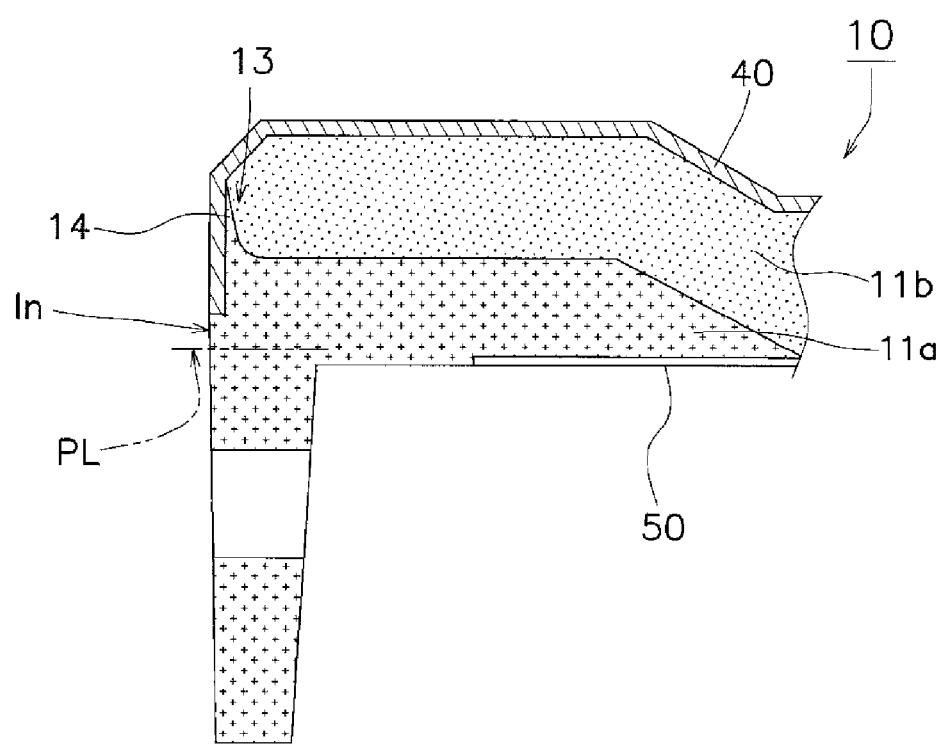
FIG. 4A is an enlarged partial cross-sectional view of the molded article in FIG. 3.

As illustrated in FIG. 4A, the shade structure 12 according to the first embodiment is a rib 14 disposed on a peripheral edge portion 13 of the first molded portion 11a so as to be erected. In this embodiment, the rib 14 is provided along the entire outer peripheral edge 40e of the decorative sheet 40. The rib 14 is made of the opaque resin forming the first molded portion 11a and covers the gap In between the parting line PL of the second molded portion 11b and the decorative sheet 40. Further, the rib 14 blocks the light Li that travels from the second molded portion 11b to outside of the molded article 10.

Figure 4B:
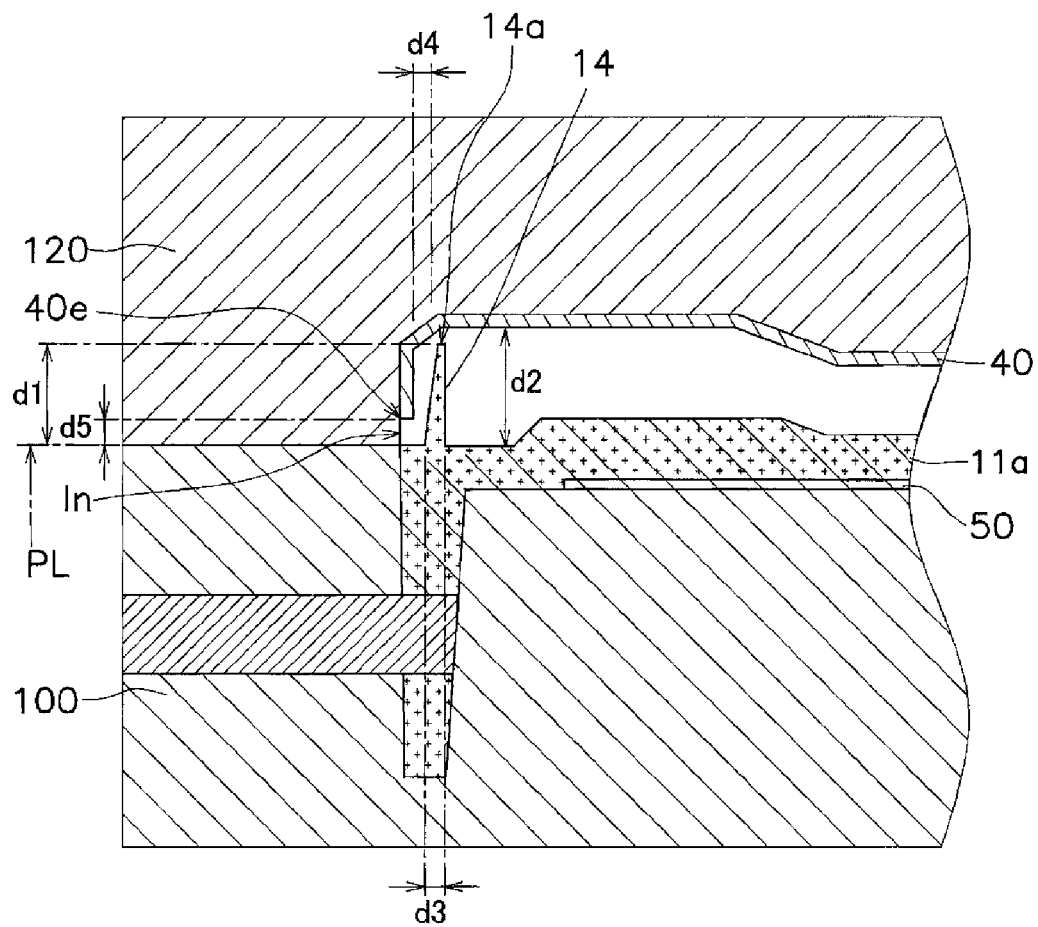
FIG. 4B is a partial enlarged cross-sectional view illustrating a mold and a first molded portion in a manufacturing process for the molded article illustrated in FIG. 4A.

FIG. 4B illustrates one step in the manufacturing process for forming the shade structure 12. The state shown in FIG. 4B is a state before clamping a movable platen 100 into a second stationary platen 120 and injecting molten resin into a cavity in the second stationary platen 120. The first molded portion 11a is already formed in the movable platen 100. The touch sensor sheet 50 is integrated with the first molded portion 11a during molding of the first molded portion 11a. The rib 14 formed on the peripheral edge portion 13 of the first molded portion 11a is erected to a position higher than the outer peripheral edge 40e of the decorative sheet 40. In the state illustrated in FIG. 4B, the rib 14 does not yet cover the gap In between the second molded portion 11b and the outer peripheral edge 40e of the decorative sheet 40. The rib 14 is deformed by heat and pressure of the molten resin injected to form the second molded portion 11b, resulting in a shade structure such as that illustrated in FIG. 4A that can block the light Li passing through the second molded portion 11b made of a light-transmitting resin.

(2) Configuration of Components (2-1) First Molded Portion 11a and Second Molded Portion 11b The resin forming the first molded portion 11a and the second molded portion 11b may be, for example, a polycarbonate resin, an acrylonitrile butadiene styrene (ABS) resin, an acrylic resin, a polyamide resin, a polyethylene terephthalate (PET) resin, a polybutylene terephthalate (PBT) resin, a polypropylene resin, a polyester resin, a polyester elastomer, or a polyurethane elastomer, or combinations of different resins using these materials.

The first molded portion 11a is made not to melt to the extent that the shape of the first molded portion 11a can no longer be completely maintained during molding of the second molded portion 11b. Therefore, the resin forming the first molded portion 11a preferably has a softening temperature that is equal to or higher than the resin forming the second molded portion 11b. Moreover, the first molded portion 11a may contain a filler to adjust the fluidity of the first molded portion 11a. Examples of fillers compounded in the first molded portion 11a include glass fiber and carbon. In order to cover the gap In to prevent light leakage by deforming the rib 14 during injection of the light-transmitting resin forming the second molded portion 11b, the second molded portion 11b preferably has a softening temperature equivalent to or close to that of the opaque resin forming the first molded portion 11a. In typical two-color molding, the resin forming the first molded portion 11a has a softening temperature equivalent to or slightly higher than that of the resin forming the second molded portion 11b in order to prevent the resin forming the first molded portion 11a from flowing out due to the resin forming the second molded portion 11b. However, the resin forming the first molded portion 11a easily softens when this resin is flaky, similar to the rib 14 according to this disclosure.

The opaque resin used for the first molded portion 11a may be, for example, a resin that is inherently colored or may be colored with a pigment. The first molded portion (2-2) Decorative Sheet 40

The decorative sheet 40 includes a base film and a graphic layer. A transparent resin is used for the base film. The base film may be made of, for example, a resin film made of a polyester resin, a polyethylene terephthalate (PET) resin, an acrylic resin, a polycarbonate resin, a polybutylene terephthalate (PBT) resin, a triacetyl cellulose resin, a styrene resin, or an ABS resin, a multilayer film made of an acrylic resin and an ABS resin, or a multilayer film made of an acrylic resin and a polycarbonate resin. The thickness of the base film is generally selected from a range from, for example, 30 μm to 500 μm.

The graphic layer is a layer used to express a design such as an illustration. The graphic layer is formed on the base film using, for example, gravure printing or screen printing. The materials forming the graphic layer may be, for example, an acrylic resin, a vinyl chloride vinyl acetate copolymer resin, a thermoplastic urethane resin or a polyester resin, and a pigment or dye that is added to the resin. The graphic layer may also have a metallic design formed using, for example, an insulated aluminum paste or mirror ink.

A hardcoat layer for improving surface strength and imparting scratch resistance may be formed on the decorative sheet 40. Additionally, an adhesive layer may be formed on the decorative sheet 40 to improve adhesion between the decorative sheet 40 and the molded article body 11.

The graphic layer is transparent at a portion provided with the display portion 41 on the decorative sheet 40. Therefore, in the display portion 41 of the decorative sheet 40, the light Li irradiated from the LED 80 is emitted to the outside after passing through the base film and the graphic layer.

(2-3) Touch Sensor Sheet 50

The touch sensor sheet 50 is a sheet formed with an electrical circuit for configuring, for example, an electrostatic capacitance type touch sensor. The touch sensor sheet 50 includes an electrode for detecting information, input by a human body (fingertip), as a change in electrostatic capacitance. A transparent electrode is used for an electrode disposed at a location through which the light Li irradiated from the LED 80 passes. The transparent electrode of the touch sensor sheet 50 is formed of, for example, a metal oxide, a transparent conductive polymer, or a transparent conductive ink. Examples of metal oxides include indium tin oxide (ITO) and indium zinc oxide (IZO). An example of a transparent conductive polymer is poly-3,4-ethylenedioxythiophene/polysulfonic acid (PEDOT/PSS). Examples of transparent conductive ink include carbon nanotubes or silver nanofibers compounded in a binder. In place of the transparent electrode, a touch sensor function can also be easily realized by printing a non-light-transmitting conductive ink (e.g., silver paste or conductive carbon ink) around a non-electrically conductive light-transmitting part.

(2-4) FPC 51

The FPC 51 includes a film substrate and a conductor circuit formed on the film substrate. The conductor circuit is exposed at an end portion of the film substrate. Examples of film substrates that can be used include flexible insulating films made of, for example, polyimide (PI), polyethylene terephthalate (PET), and polyethylene naphthalate (PEN). The film substrate is, for example, from 25 µm to 75 µm. The conductor circuit is formed by photo-etching copper foil laminated on a film substrate and then laminating a film substrate of the same quality to protect the circuit layer. The FPC 51 may be formed using a silver paste, copper paste, carbon paste or the like to form a circuit layer by means, such as screen printing, and then printing an overcoat layer for protection. Note that a cover film with an adhesive may be applied to the FPC 51. The FPC 51 and the touch sensor sheet 50 are electrically connected to each other by an anisotropic conductive film. Further, the first molded portion 11*a* covers a portion of the FPC 51 of the touch sensor sheet 50, with the FPC 51 being connected to the controller 90, which is a device external to the molded article. The FPC 51 can be regarded as a lead out wiring unit in which only the plurality of lead out wires in the touch sensor sheet 50 extend outward.

(3) Method for Manufacturing Molded Article 10

Figure 5A:
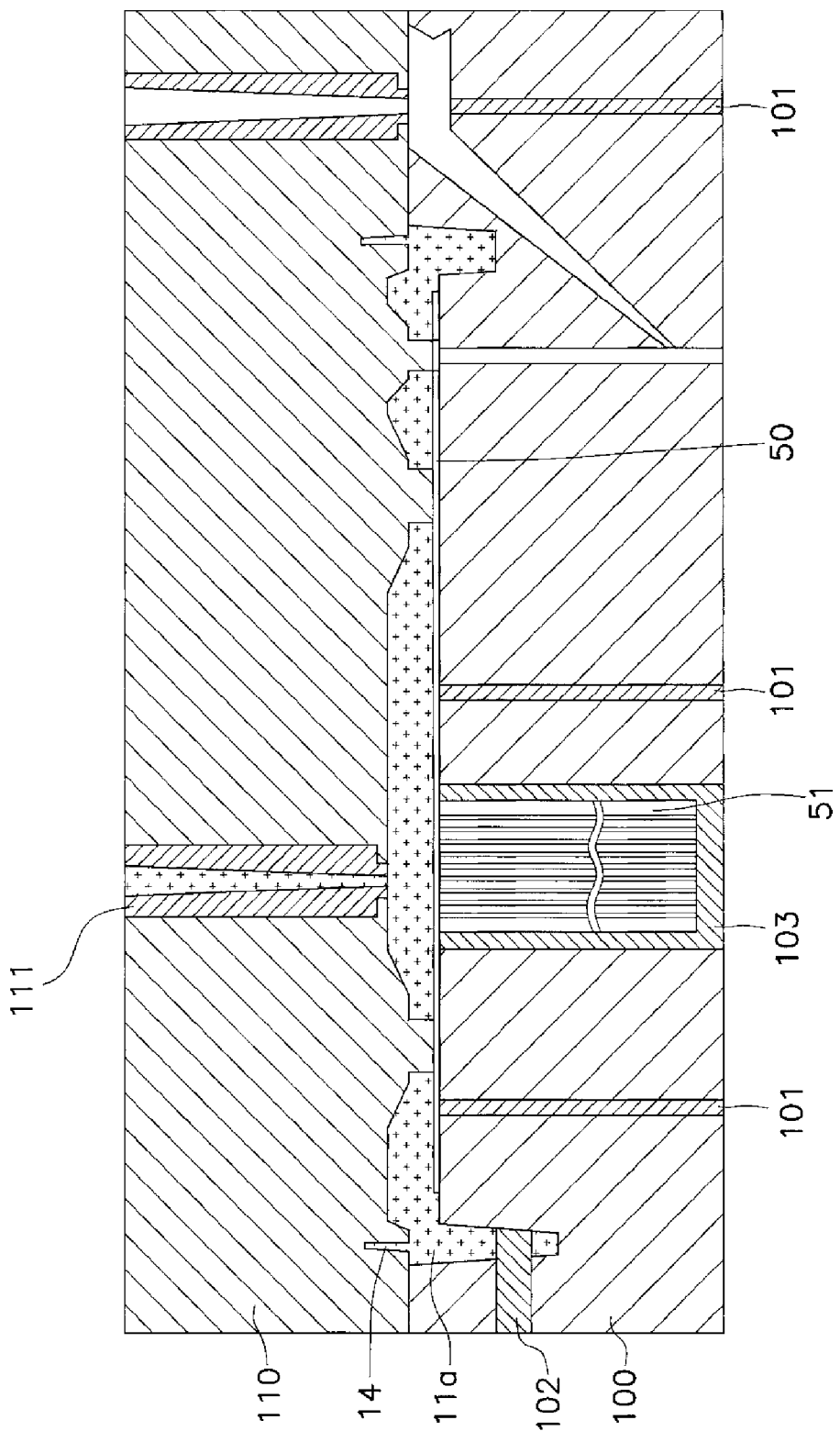
FIG. 5A is a cross-sectional view illustrating an injection process for the first molded portion according to the first embodiment.

A method for manufacturing the molded article 10 is now described with reference to FIGS. 5A to 5D. FIG. 5A illustrates a state in which the movable platen 100 is clamped into a first fixed platen 110 to form the first molded portion 11*a*. Before the movable platen 100 is clamped into the first fixed platen 110, the touch sensor sheet 50 attached to the FPC 51 is set in the movable platen 100. A molten resin is injected through a sprue 111 into a cavity between the movable platen 100 and the first fixed platen 110. Then, the molten resin cools and solidifies in the cavity between the movable platen 100 and the first fixed platen 110, thereby forming the first molded portion 11*a*. The movable platen 100 is provided with ejector pins 101, a slide core 102, and a slide core 103 for storing the FPC 51.

When molding of the first molded portion 11*a* is complete, mold opening is implemented from the state illustrated in FIG. 5A, with the first molded portion 11*a* remaining fixed to the movable platen 100. Thereafter, the movable platen 100 rotates, for example, and moves to be in front of the second fixed platen 120.

Figure 5B:
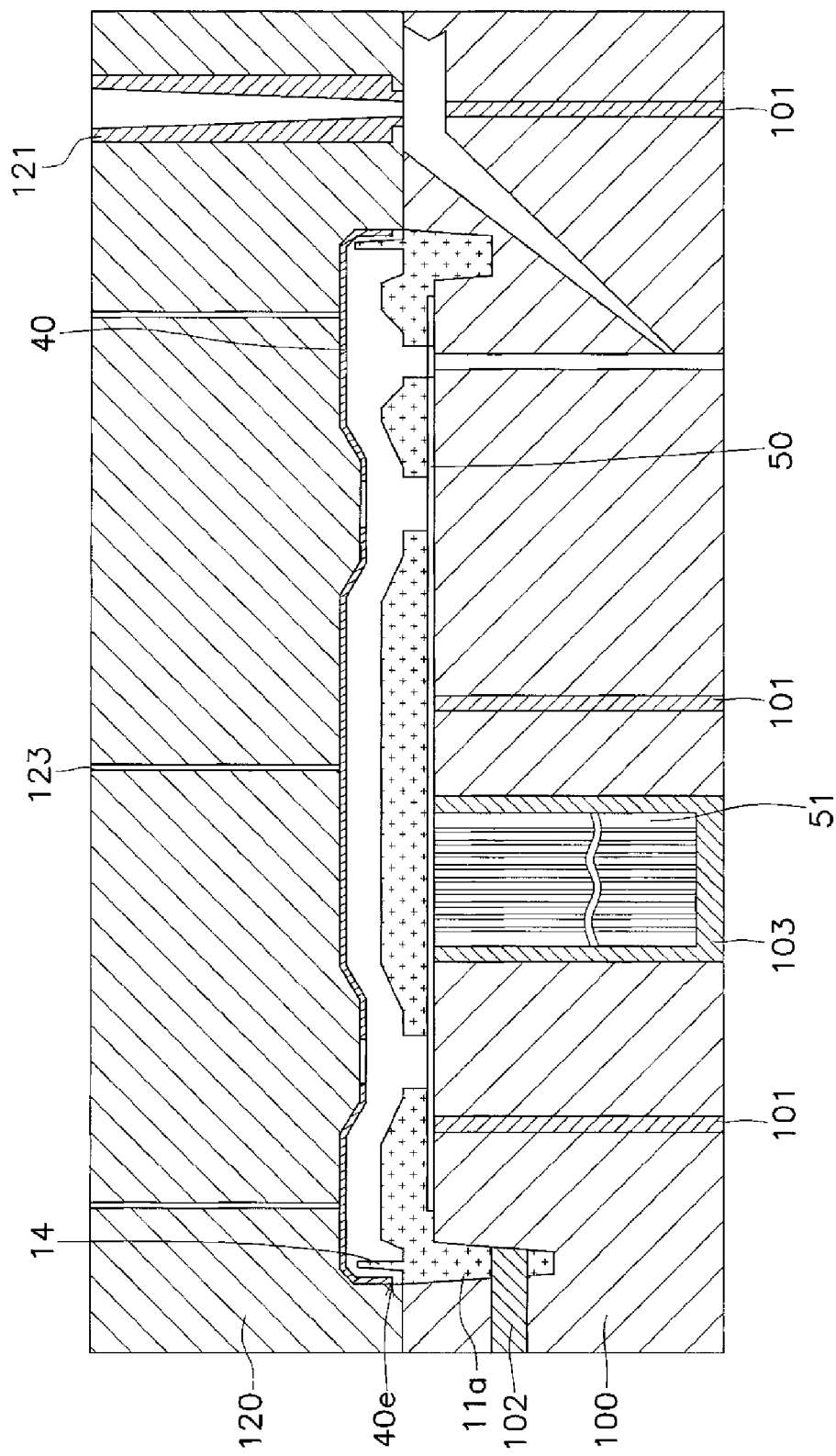
FIG. 5B is a cross-sectional view illustrating a clamping process for manufacturing a second molded portion according to the first embodiment.

FIG. 5B illustrates a state in which the movable platen 100 is clamped into the second fixed platen 120. The decorative sheet 40 is set in the second fixed platen 120. The decorative sheet 40 is suctioned by air through, for example, a suction hole 123 and adsorbed to the inner surface of the second fixed platen 120. In the first embodiment, a case in which the decorative sheet 40 is not preformed is described, but the decorative sheet 40 may be preformed so as to conform to the inner surface of the cavity in the second fixed platen 120.

Before molding the second molded portion 11*b*, a height d1 (see FIG. 4B) of the rib 14 from the parting line PL needs to be higher than a height d5 (see FIG. 4B) of the gap In between the outer peripheral edge 40*e* of the decorative sheet 40 and the parting line PL of the first molded portion 11*a*. For example, it is sufficient that d5+0.3 mm<d1<d2. For example, if d5 is 0.2 mm and d2 is 2.0 mm, approximately 0.5 mm<d1<1.5 mm is satisfactory. If d5 is 1 mm and d2 is 2.0 mm, approximately 1.3 mm<d1<1.8 mm is satisfactory.

A thickness d3 (see FIG. 4B) of the rib 14 is preferably thin so that the rib 14 can deform more easily. However, in order to retain the shape of the rib 14, the thickness d3 preferably remains thick until the molten resin for forming the second molded portion 11*b* is injected. The thickness d3 of the rib 14 is preferably from 0.2 mm to 1.0 mm at a base thereof, preferably from 0.02 mm to 0.7 mm at a tip 14*a* thereof, preferably from 0.3 mm to 0.7 mm at the base, and preferably from 0.1 mm to 0.4 mm at the tip 14*a*. A distance d4 from the outer surface of the rib 14 to the inner surface of the decorative sheet 40 is preferably set to be from 0.2 mm to 0.5 mm at the base of the rib 14 and from 0.5 mm to 1.0 mm at the tip 14*a*.

Figure 5C:
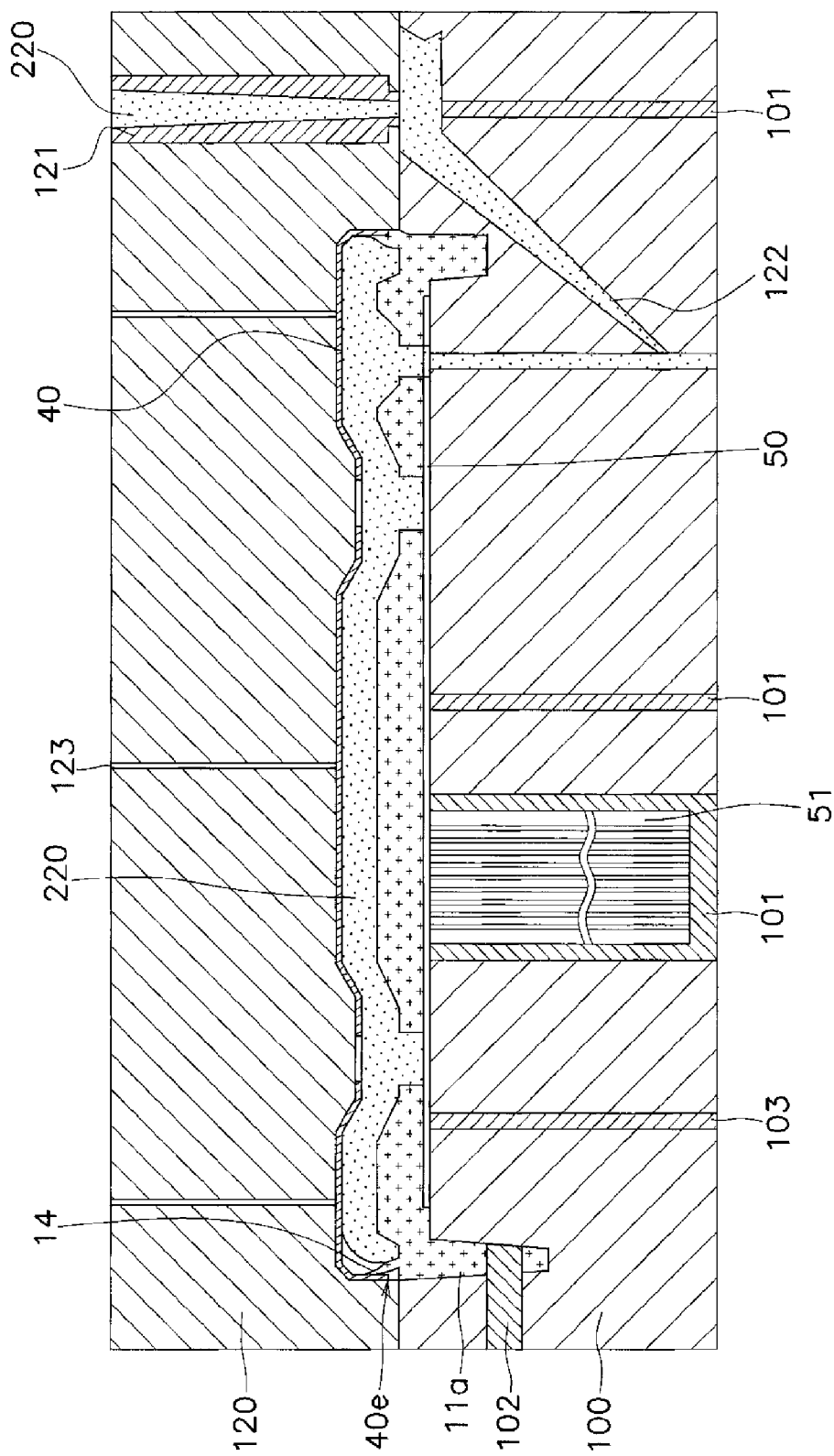
FIG. 5C is a cross-sectional view illustrating an injection process for the second molded portion according to the first embodiment.

FIG. 5C illustrates a state in which a molten resin 220 for molding the second molded portion 11*b* has been injected. The molten resin 220 is injected through a sprue 121 and a runner 122 into a cavity between the movable platen 100 and the second fixed platen 120. The rib 14 is softened by the heat of the molten resin 220 and deformed by the pressure of the molten resin 220 to fill the gap In between the decorative sheet 40 and the first molded portion 11*a*.

Figure 5D:
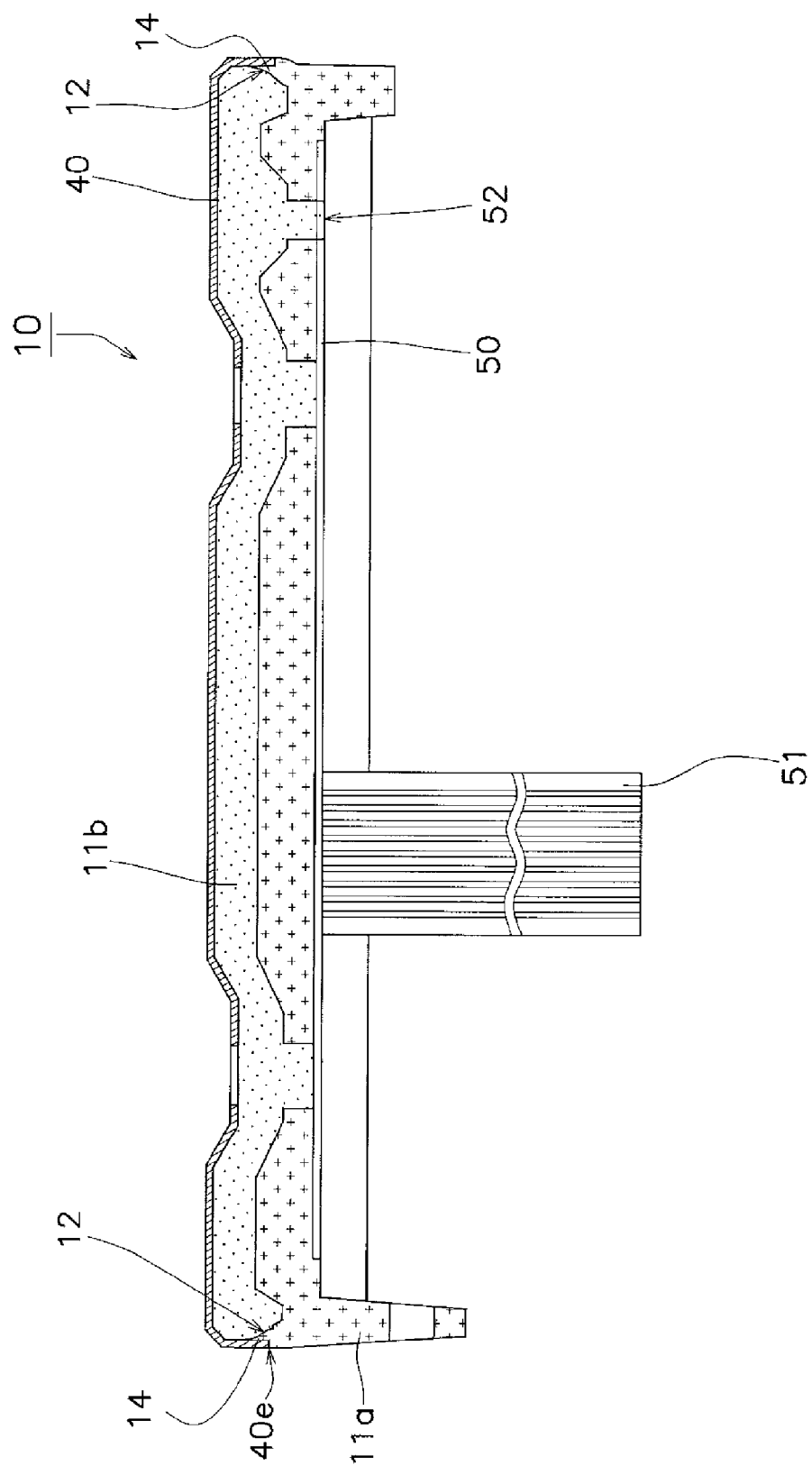
FIG. 5D is a cross-sectional view illustrating an example of the molded article according to the first embodiment.

When the molten resin 220 cools and solidifies and then forms the second molded portion 11*b*, the slide cores 102 and 103 slide out of the first molded portion 11*a* and the second fixed platen 120 and the movable platen 100 are opened. FIG. 5D illustrates the molded article 10 removed from the movable platen 100 by the ejector pins 101. As illustrated in FIG. 5D, a resin introduction hole 52 for injecting the molten resin 220 described above is formed in the touch sensor sheet 50. The outer surface of the decorative sheet 40 and the outer surface of the first molded portion 11*a* are formed flush with each other with no gap therebetween, due to the heat and pressure of the molten resin 220. The rib 14, which is deformed, serves as the shade structure 12. By providing the shade structure 12, the light Li, irradiated from the LED 80 (see FIG. 2) and passing through the second molded portion 11*b* made of light-transmitting resin, can be prevented from leaking out from near the outer peripheral edge 40*e* of the decorative sheet 40, particularly from the gap In between the outer peripheral edge 40*e* and the parting line PL of the first molded portion 11*a*, due to, for instance, refraction or reflection thereof.

(4) Modification Examples (4-1) Modification Example 1A

Figure 6A:
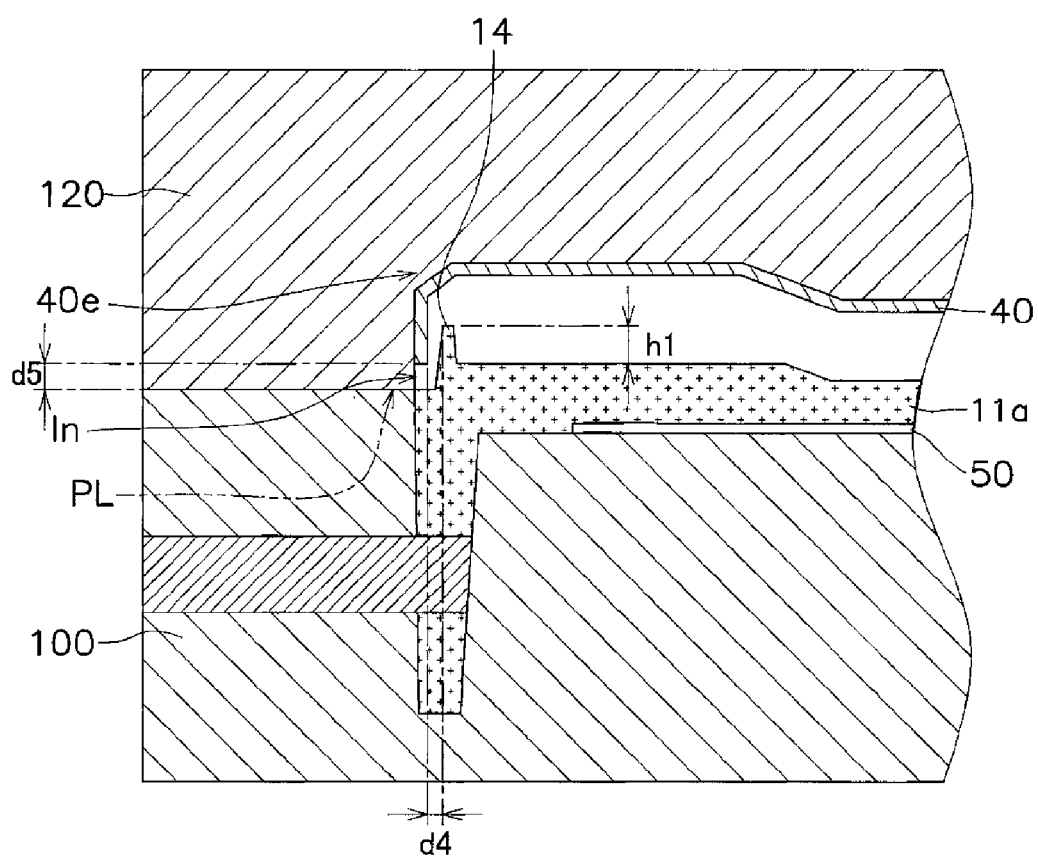
FIG. 6A is a partial enlarged cross-sectional view illustrating a mold and a first molded portion in a molding process for a molded article according to Modification Example 1A.
Figure 6B:
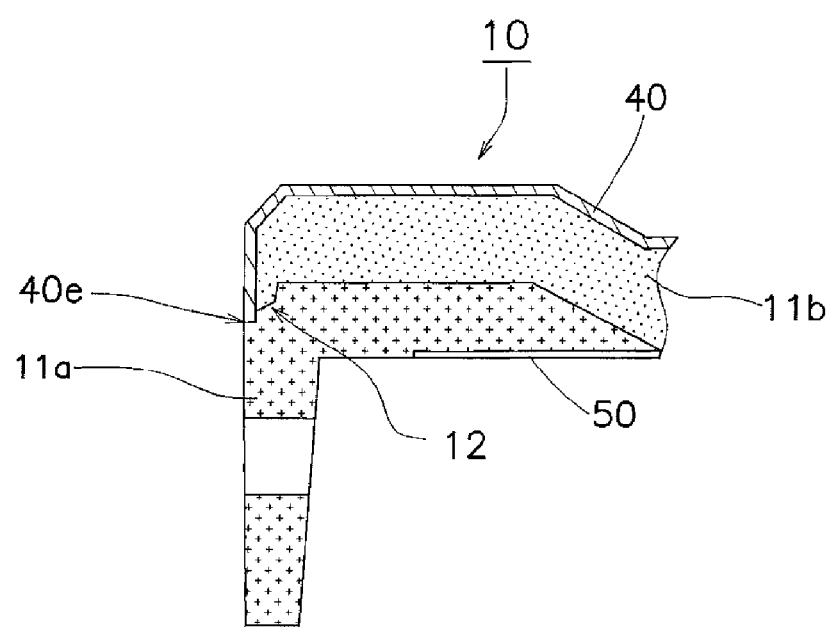
FIG. 6B is an enlarged partial cross-sectional view of the molded article according to Modification Example 1A.

In the first embodiment described above, a case is described in which the rib 14 of the shade structure 12 is erected and extended above the outer peripheral edge 40*e* of the decorative sheet 40. However, the rib 14 may be collapsed as illustrated in FIG. 6B. As illustrated in FIG. 6A, in the gap In, the distance d5 from the parting line PL to the outer peripheral edge 40*e* of the decorative sheet 40 is, for example, from 0.05 mm to 0.7 mm. Therefore, when a height h1 of the rib 14 is small and the distance d4 between the rib 14 and the decorative sheet 40 is large, the gap In can be covered even if the rib 14 is collapsed. Therefore, a collapsed rib 14 may be used as the shade structure 12.

(4-2) Modification Example 1B

Figure 7A:
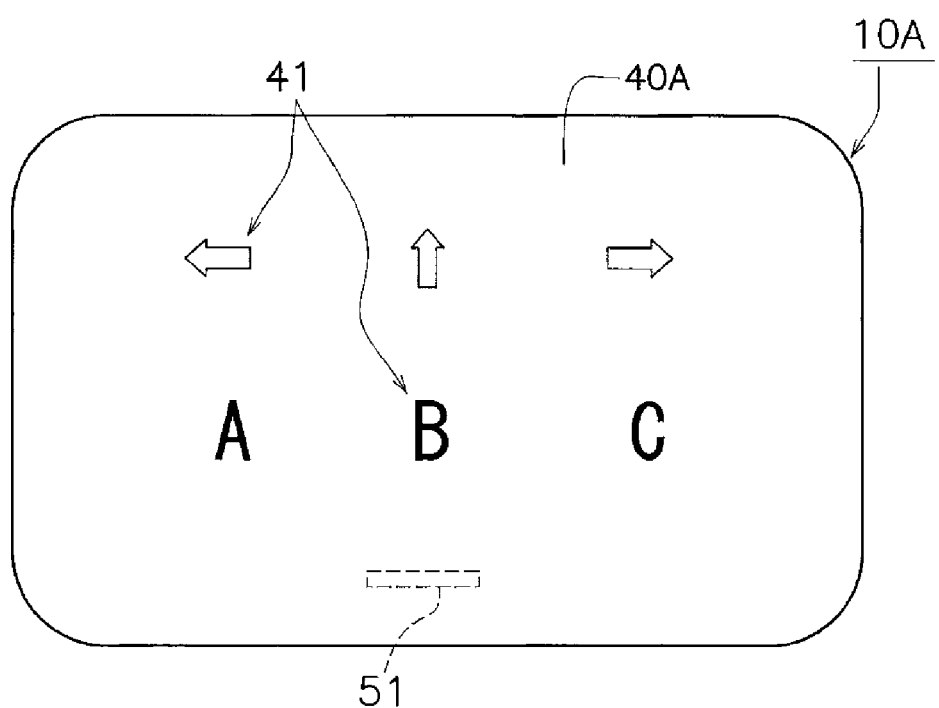
FIG. 7A is a plan view of a molded article according to Modification Example 1B.

In the first embodiment described above, a case is described in which the shade structure 12 covers the entire periphery of the molded article 10. The molded article may be configured such that the shade structure does not cover the entire periphery of the molded article. The molded article 10 illustrated in FIG. 3 has a complex shape. Therefore, a configuration in which the shade structure does not cover the entire periphery of the molded article is described with reference to a molded article 10A illustrated in FIGS. 7A to 7D. As illustrated in FIG. 7A, the molded article 10A has a substantially rectangular shape when viewed from above. The top surface of the molded article 10A is covered with the decorative sheet 40. The decorative sheet 40 includes the display portion 41 in which arrows and letters A, B and C are illustrated. Light passes through the display portion 41. The FPC 51 is indicated by dashed lines in FIG. 7A.

Figure 7B:
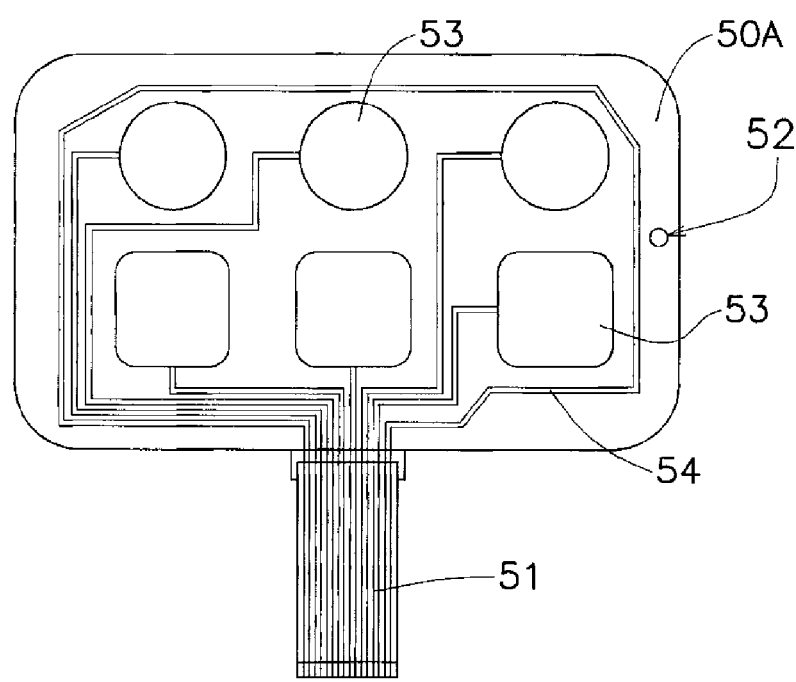
FIG. 7B is a plan view of a touch sensor sheet in the molded article according to Modification Example 1B.

FIG. 7B illustrates a touch sensor sheet 50A when viewed from above. Three transparent electrodes 53 each having a circular shape and three transparent electrodes 53 each having a square shape are formed on the touch sensor sheet 50A. The circular transparent electrodes 53 overlap the arrows on the display portion 41 and the square transparent electrodes 53 overlap the letters A, B and C on the display portion 41. A lead out wiring 54 electrically connects the transparent electrodes 53 and the FPC 51 to each other. Of the entire surface of the touch sensor sheet 50A, in an area formed with the lead out wiring 54, light may be blocked because light does not need to be transmitted in this area. The touch sensor sheet 50A is further formed with the resin introduction hole 52 through which a molten resin is injected for forming the second molded portion 11b.

Figure 7C:
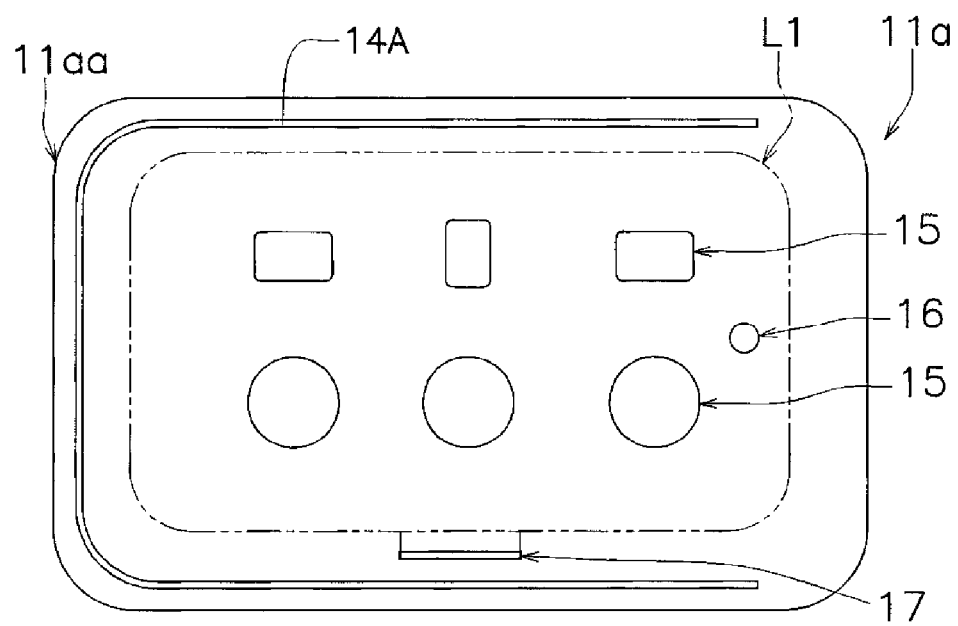
FIG. 7C is a plan view of a first molded portion according to Modification Example 1B.
Figure 7D:
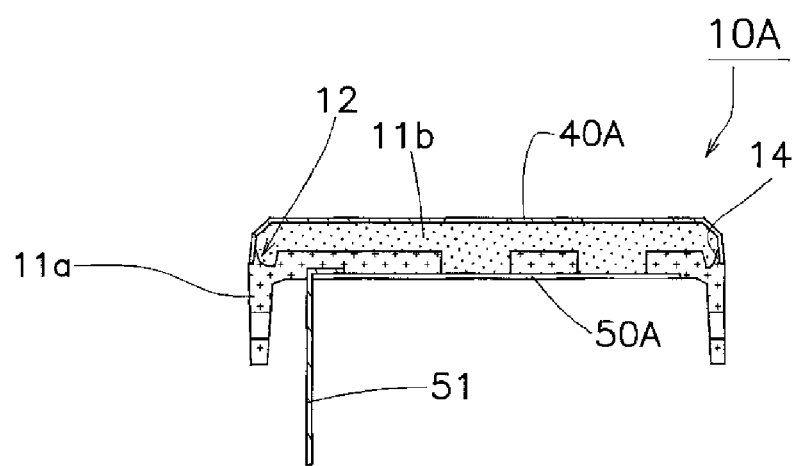
FIG. 7D is a cross-sectional view illustrating the molded article according to Modification Example 1B.

FIG. 7C illustrates the first molded portion 11a when viewed from above. FIG. 7D illustrates the cross-sectional shape of the molded article 10A. Three rectangular openings 15 and three circular openings 15 are formed in the first molded portion 11a. The rectangular openings 15 overlap the arrows on the display portion 41 and the circular openings 15 overlap the letters A, B and C on the display portion 41. The first molded portion 11a is further formed with a resin introduction hole 16 through which a molten resin is injected to form the second molded portion 11b. The first molded portion 11a is also formed with an opening 17 in which the FPC 51 is disposed. In FIG. 7C, the touch sensor sheet 50A is disposed in a region surrounded by a two-dot line L1.

When viewed from above, a rib 14A is formed along two long sides and one short side of the substantially rectangular shaped molded article 10A, but is not formed along the other short side of the molded article 10A. The rib 14A does not surround the entire peripheral edge portion 11aa of the first molded portion 11a. For example, when the side on which the FPC 51 is disposed is a rear side, the molded article 10A illustrated in FIG. 7A is not surrounded by the rib 14A on the right side, out of the front and back and left and right sides.

Figure 7E:
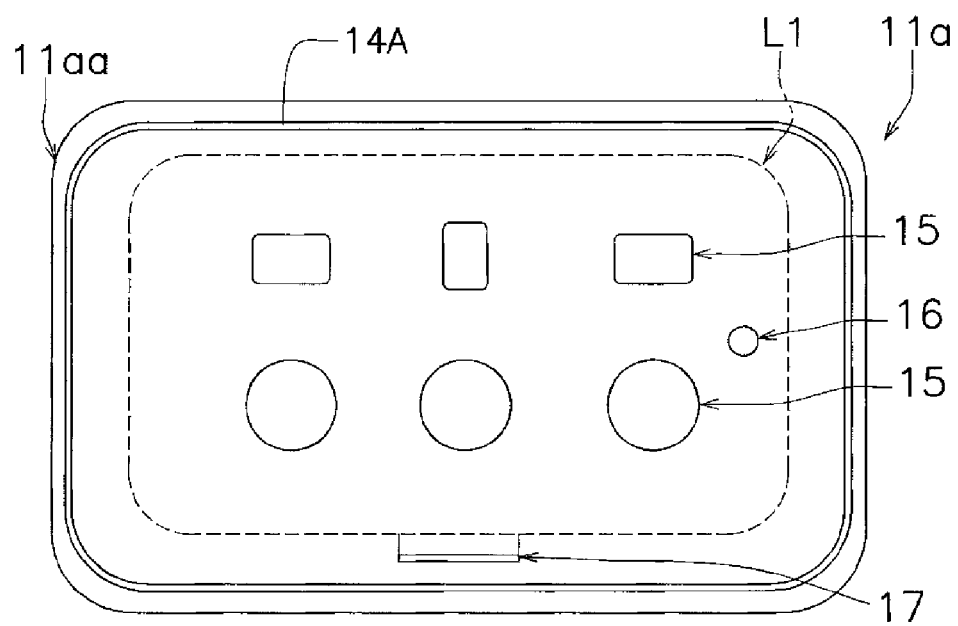
FIG. 7E is a plan view of the first molded portion when the entire periphery of the first molded portion is surrounded by a rib.
Figure 7F:
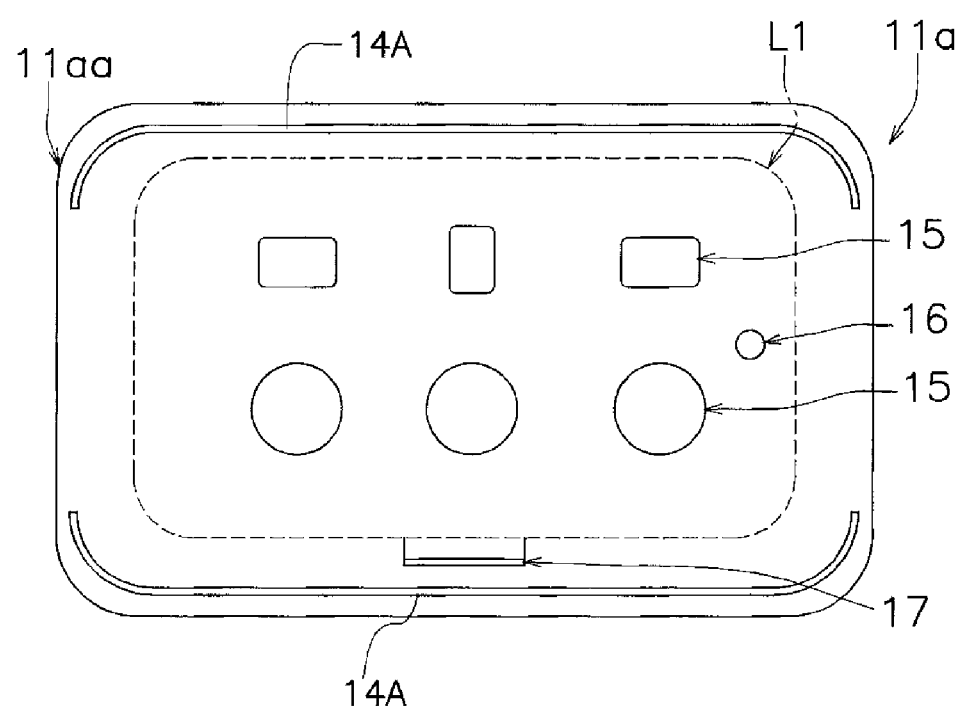
FIG. 7F is a plan view of the first molded portion when ribs are disposed along two long sides of the first molded portion.

When the entire periphery of the molded article 10A is surrounded by the rib 14A, the first molded portion 11a has the shape illustrated in FIG. 7E. Further, as illustrated in FIG. 7F, the ribs 14A may be configured to block light on only two sides along the long sides of the molded article 10A.

(4-3) Modification Example 1C

In the first embodiment described above, a case in which the display portion 41 is formed, with the graphic layer of the decorative sheet 40 being transparent, is described, but the graphic layer may be formed to be translucent and the display portion 41 may be formed by providing an opening in the decorative sheet 40. Note that the same applies to the second and third embodiments described below.

(4-4) Modification Example 1D

In the first embodiment described above, a case is described in which the light emitting element included in the display device 1 is the LED 80, but the light emitting element may be an element other than an LED. The light emitting element included in the display device 1 may be, for example, a fluorescent lamp, an incandescent lamp, or an electroluminescence element. Note that the same applies to the second and third embodiments described below.

(4-5) Modification Example 1E

In the first embodiment described above, a case is described in which the FPC 51 is used to connect the touch sensor sheet 50 to a device (for example, the controller 90) external relative to the molded article 10. However, the touch sensor sheet 50 itself may include a connection circuit that extends to the outside of the molded article 10. In other words, the touch sensor sheet may be configured such that the touch sensor sheet 50 and the FPC 51 according to the first embodiment are integrated. Note that the same applies to the second and third embodiments described below.

(4-6) Modification Example 1F

In the first embodiment described above, a case is described in which the first molded portion 11a and the second molded portion 11b are formed using two-color molding, but the molded article body 11 may further have another molded portion, and, the technology of the present disclosure can also be applied to polychromatic molding (or multi-material injection molding) that uses three or more different colored resins or three or more different materials. Note that the same applies to the second and third embodiments described below.

Second Embodiment (5) Overall Configuration

In the first embodiment described above, a case in which the ribs 14 are disposed inward of the outer peripheral edge 40e of the decorative sheet 40 is described. However, in a molded article 10B according to a second embodiment illustrated in FIG. 8A, a rib 14B is disposed outward of the outer peripheral edge 40e of the decorative sheet 40. The molded article 10B according to the second embodiment differs from the molded article 10 according to the first embodiment in terms of the shade structure 12. Other than this structure, components of identical structures are assigned with the same reference signs, and descriptions of those components are omitted.

As illustrated in FIG. 8A, the shade structure 12 according to the second embodiment is the rib 14B, which is disposed on the peripheral edge portion 13 of the first molded portion 11a and erected. In this embodiment, the rib 14B is provided around the entire outer peripheral edge 40e of the decorative sheet 40. The rib 14B is made of the opaque resin forming the first molded portion 11a and covers the gap In between the parting line PL of the second molded portion 11b and the decorative sheet 40. Further, the rib 14B blocks the light Li traveling from the second molded portion 11b to the outside of the molded article 10B.

(6) Method for Manufacturing Molded Article 10B

Figure 8B:
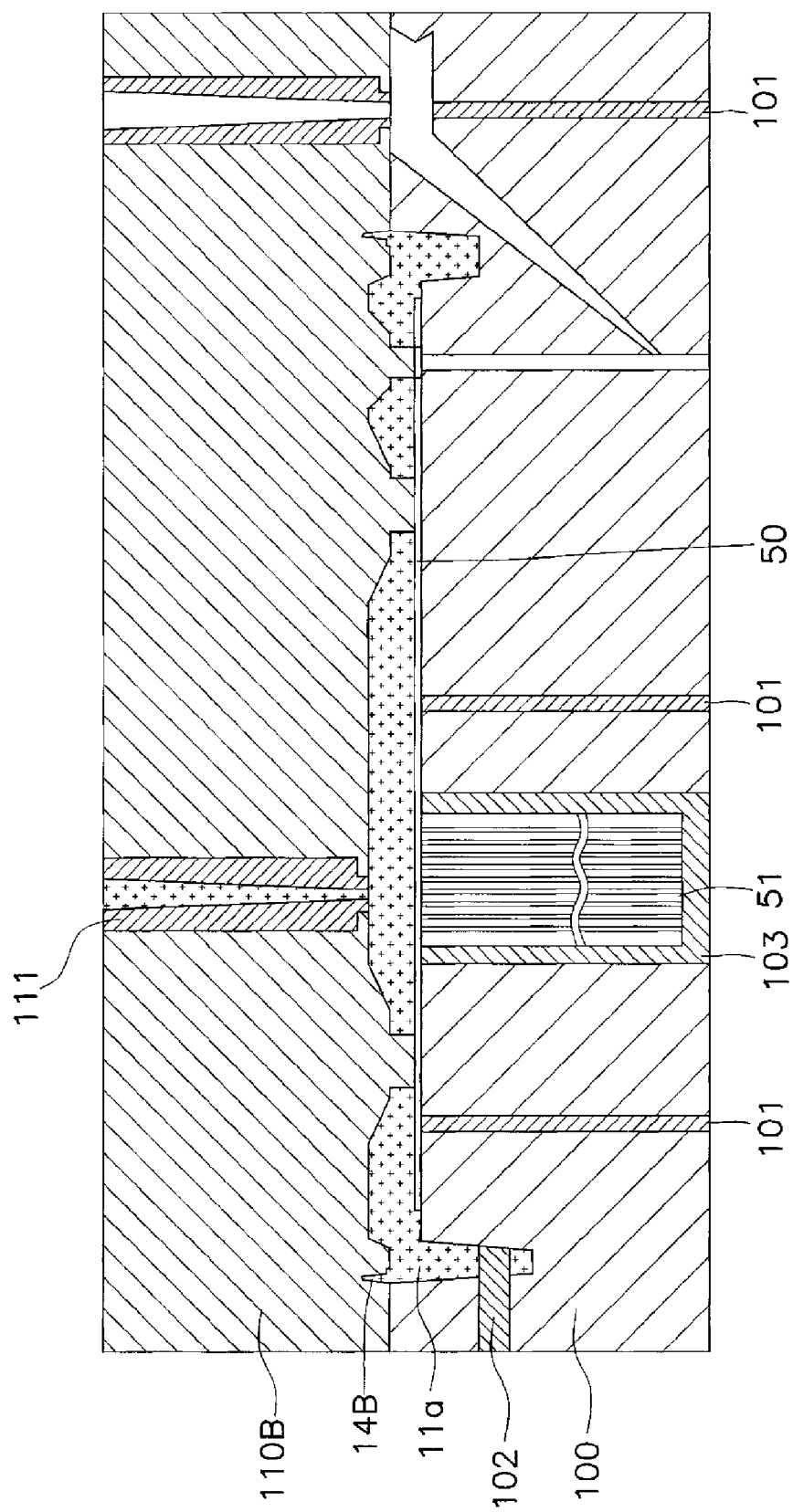
FIG. 8B is a cross-sectional view illustrating an injection process for a first molded portion according to the second embodiment.

A method for manufacturing the molded article 10B is described with reference to FIGS. 8B to 8D. FIG. 8B illustrates a state in which the movable platen 100 is clamped into a first fixed platen 110B, whereby the first molded portion 11a is formed. The first fixed platen 110 according to the first embodiment differs from the first fixed platen 110B according to the second embodiment in terms of the structures for forming the ribs 14 and 14B. Before the movable platen 100 is clamped into the first fixed platen 110B, the touch sensor sheet 50 attached to the FPC 51 is set in the movable platen 100. A molten resin is injected through the sprue 111 into a cavity between the movable platen 100 and first fixed platen 110B. Then, the molten resin cools and solidifies in the cavity between the movable platen 100 and the first fixed platen 110B, whereby the first molded portion 11a is formed.

When molding of the first molded portion 11a is complete, the mold is opened from the state illustrated in FIG. 8B. with the first molded portion 11a remaining fixed to the movable platen 100. Then, the movable platen 100 rotates, for example, and moves to the front of the second fixed platen 120.

Figure 8C:
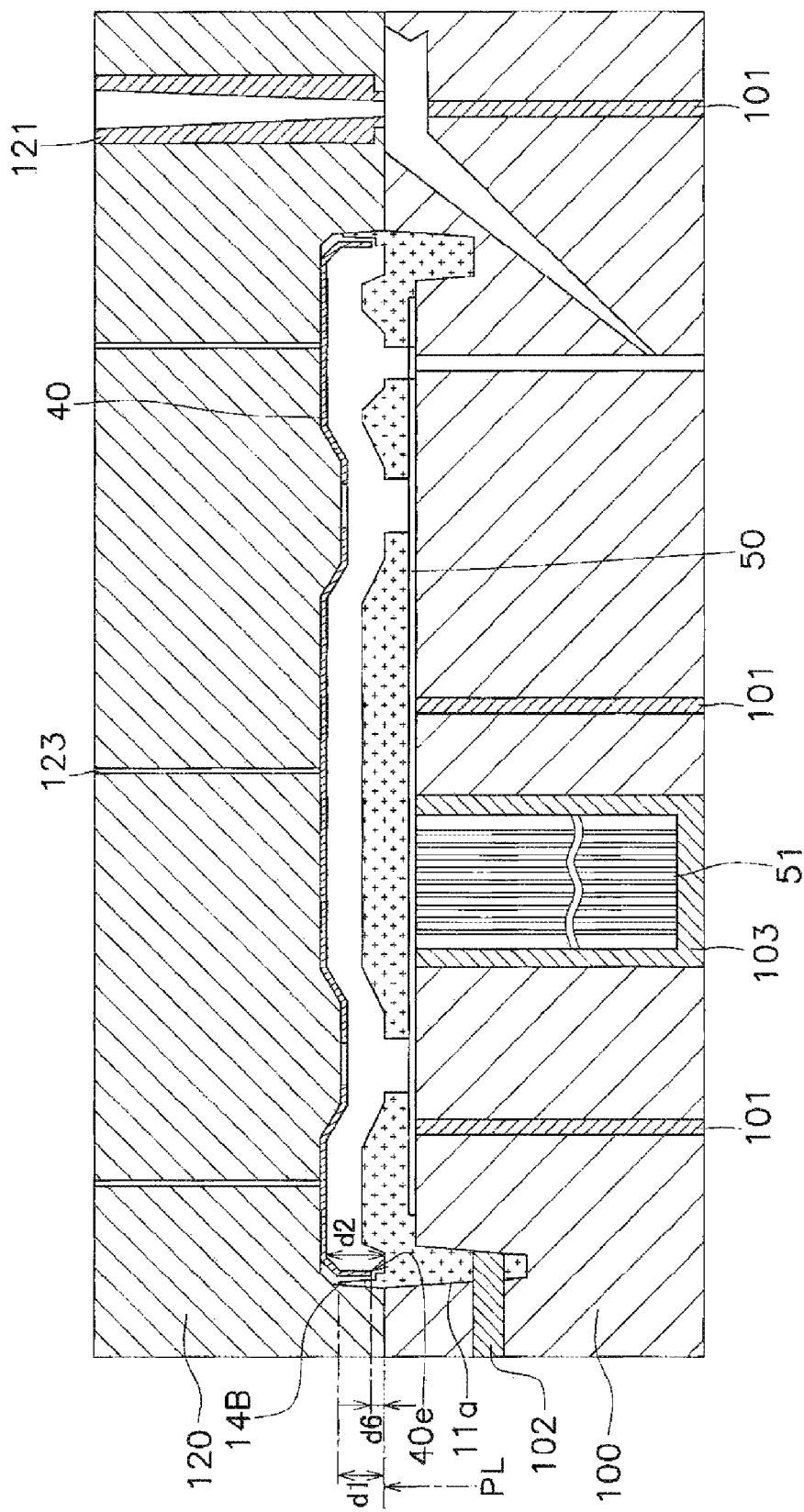
FIG. 8C is a cross-sectional view illustrating a clamping process for manufacturing a second molded portion according to the second embodiment.

FIG. 8C illustrates a state in which the movable platen 100 is clamped into the second fixed platen 120. The decorative sheet 40 is set in the second fixed platen 120. The decorative sheet 40 is preformed to conform to the inner surface of the cavity in the second fixed platen 120. The outer peripheral edge 40e of the decorative sheet 40 is preformed to be on the inside of the rib 14B. The formed decorative sheet 40 is suctioned by air through, for example, the suction hole 123 and adsorbed to the inner surface of the second fixed platen 120.

The height d1 of the rib 14B from the parting line PL needs to be greater than a height d6 of the gap In between the parting line PL and the outer peripheral edge 40e of the decorative sheet 40. It is sufficient that d6+0.3 mm<d1<d2 is satisfied. For example, when d6 is 0.2 mm and d2 is 2.0 mm, approximately 0.7 mm<d1<1.5 mm is satisfactory. When d6 is 1 mm and d2 is 2.0 mm, approximately 1.3 mm<d1<1.8 mm is satisfactory.

Figure 8D:
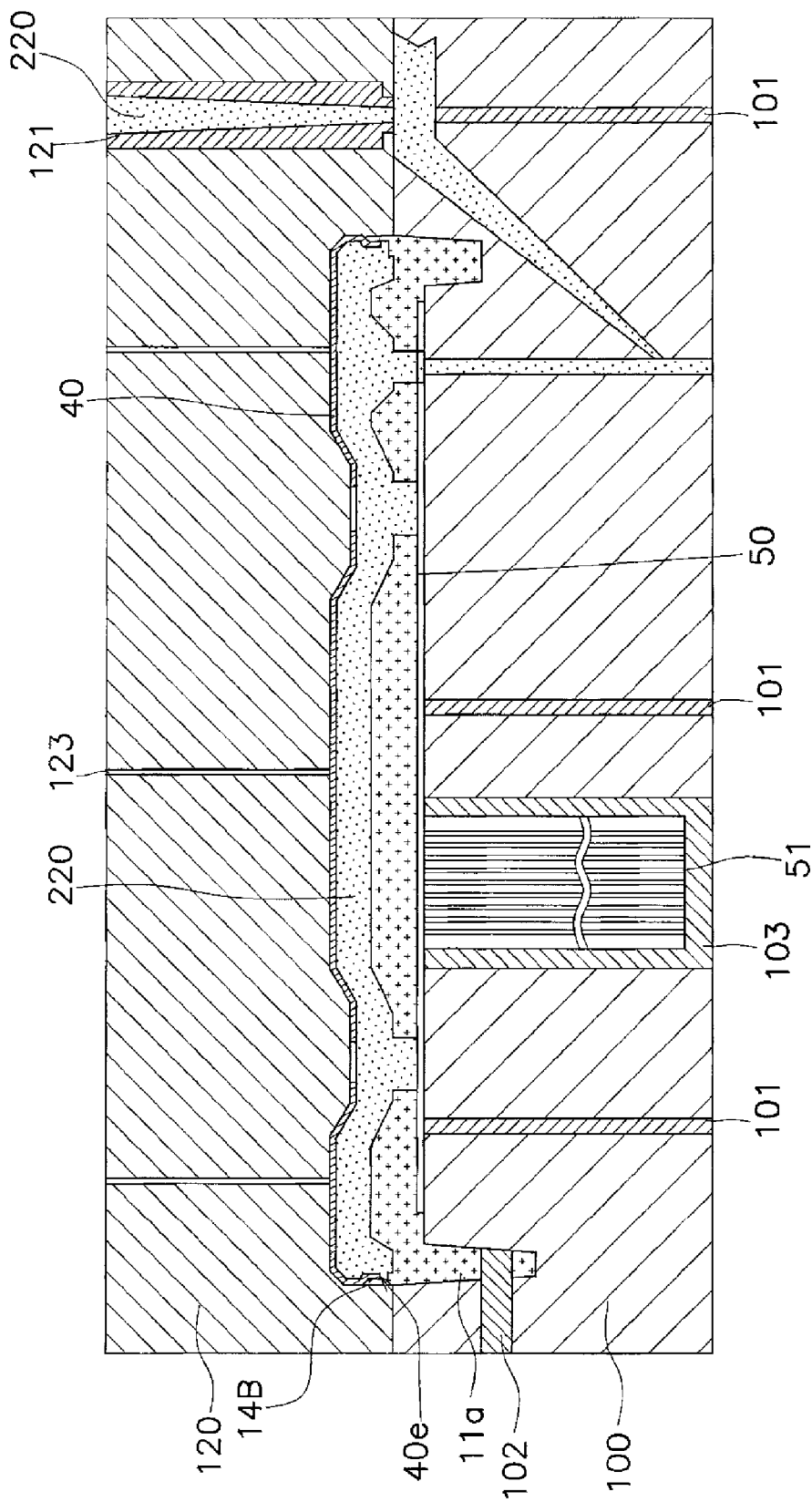
FIG. 8D is a cross-sectional view illustrating an injection process for the second molded portion according to the second embodiment.

FIG. 8D illustrates a state in which the molten resin 220 for molding the second molded portion 11b has been injected. The molten resin 220 is injected through the sprue 121 and the runner 122 into the cavity between the movable platen 100 and the second fixed platen 120. The decorative sheet 40 is softened by heat of the molten resin 220 and deformed by pressure of the molten resin 220, and is brought into contact with the inside of the rib 14A with no gap therebetween. An adhesive may be applied to the outer circumferential surface near the outer peripheral edge 40e of the decorative sheet 40 to firmly bond the inner circumferential surface of the molded rib 14A to the outer circumferential surface near the outer peripheral edge 40e of the decorative sheet 40. The adhesive applied to the outer peripheral surface near the outer peripheral edge 40e is, for example, a pressure-sensitive and/or heat-sensitive adhesive so that bonding by the molten resin 220 can be implemented.

Figure 9A:
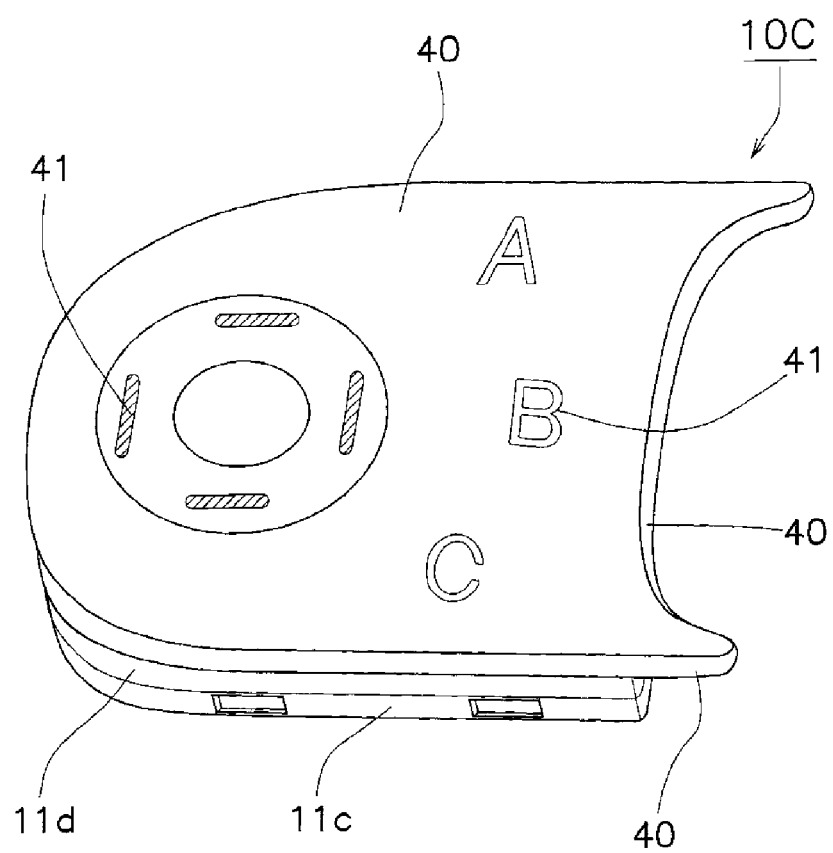
FIG. 9A is a perspective view of a molded article according to Modification Example 2A.
Figure 9B:
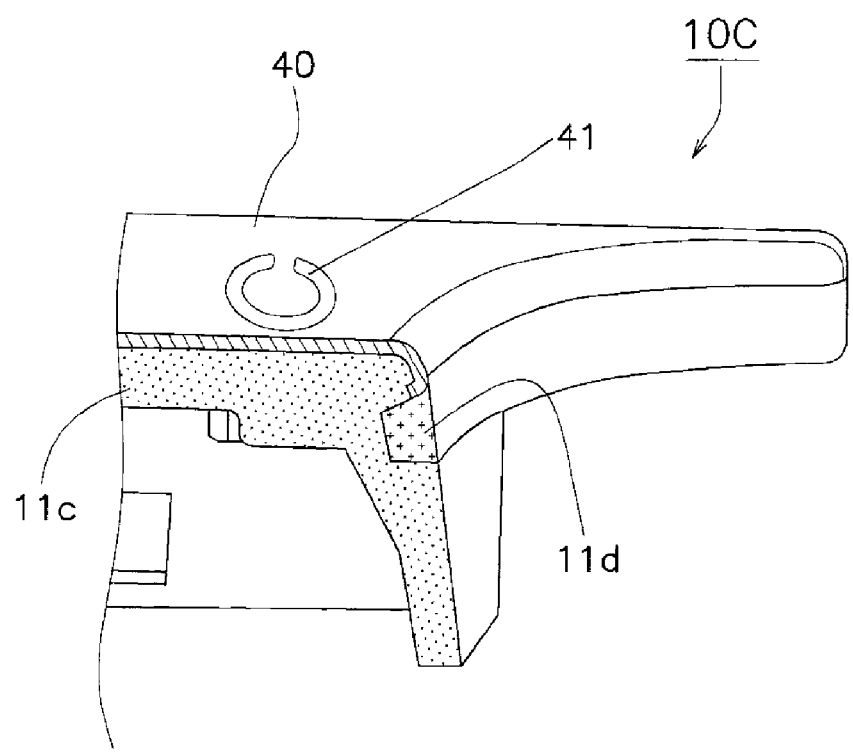
FIG. 9B is a partial cutaway perspective view of the molded article according to Modification Example 2A.
Figure 9C:
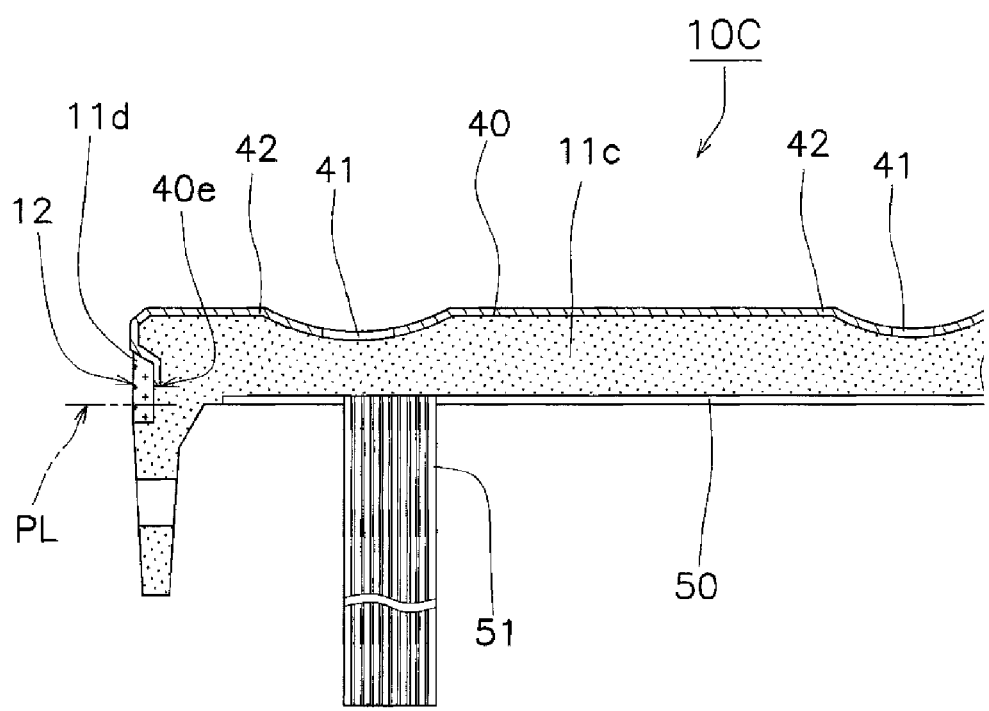
FIG. 9C is a partial enlarged cross-sectional view of the molded article according to Modification Example 2A.

When the molten resin 220 cools and solidifies thereby forming the second molded portion 11b, the slide cores 102 and 103 slide out of the first molded portion 11a and the second fixed platen 120 and the movable platen 100 open. FIG. 8A illustrates the molded article 10B removed from the movable platen 100 by the ejector pins 101. As illustrated in FIG. 8A, the resin introduction hole 52 for injecting the molten resin 220 described above is formed in the touch sensor sheet 50. The outer surface of the decorative sheet 40 and the outer surface of the first molded portion 11a are formed flush with each other with no gap therebetween due to the heat and pressure of the molten resin 220. This deformed rib 14 serves as the shade structure 12. With this shade structure 12, the light Li irradiated from the LED 80 (see FIG. 2) and passing through the second molded portion 11b made of light-transmitting resin can be prevented from leaking out from around the outer peripheral edge 40e of the decorative sheet 40, particularly from the gap In between the outer peripheral edge 40e and the parting line PL of the first molded portion 11a, due to, for instance, refraction or reflection thereof (7) Modification Example 2A In the second embodiment, a case is described in which the rib 14B forms the shade structure 12 on the outer peripheral portion around the outer peripheral edge 40e of the decorative sheet 40. However, the shade structure 12 may be formed on the outer periphery of the outer peripheral edge 40e by a method other than using the rib 14B according to the second embodiment. Another manufacturing method for forming the shade structure 12 on the outer periphery of the outer peripheral edge 40e is described with reference to FIGS. 9A to 9F. FIG. 9A illustrates a molded article 10C when viewed obliquely from above. FIG. 9B illustrates a state, in which a portion of the molded article 10C is cut away and that portion is viewed obliquely from above, and a cross section of the molded article 10C. Further, FIG. 9C illustrates a portion of the cross section of the molded article 10C according to Modification Example 2A.

In the molded article 10C, a main shape of the molded article 10C is formed of a second molded portion 11c. A first molded portion 11d primarily forms the shade structure 12. Hence, the first molded portion 11d is formed into a band shape so as to surround the outer periphery of the outer peripheral edge 40e of the decorative sheet 40. The first molded portion 11d is also integrally formed with the second molded portion 11c and the decorative sheet 40. An adhesive may be applied to an outer circumferential surface near the outer peripheral edge 40e of the decorative sheet 40 in order to securely bond the inner peripheral surface of the post-molded first molded portion 11d to the outer circumferential surface near the outer peripheral edge 40e of the decorative sheet 40. The adhesive applied to the outer peripheral surface near the outer peripheral edge 40e is, for example, a pressure-sensitive and/or heat-sensitive adhesive so that bonding by the molten resin for molding the second molded portion 11c is implemented.

Figure 9D:
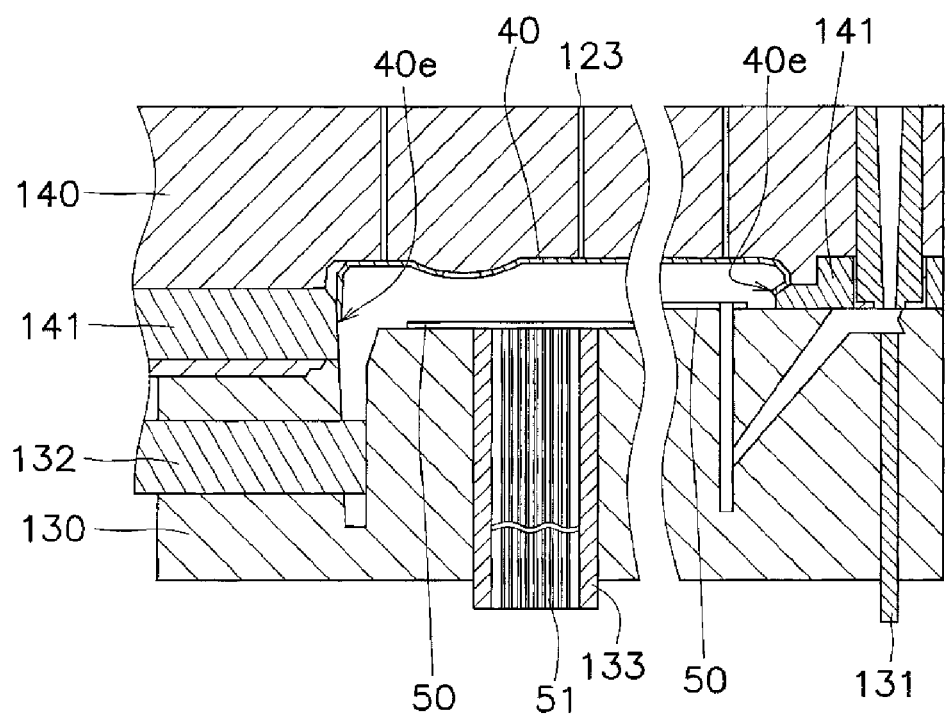
FIG. 9D is a cross-sectional view illustrating a clamping process for manufacturing the second molded portion according to Modification Example 2A.

FIG. 9D illustrates a state in which a first fixed platen 140 is clamped in a movable platen 130. The decorative sheet 40 is set in the first fixed platen 140. The decorative sheet 40 is suctioned by air through, for example, a suction hole 142 and adsorbed to the inner surface of the first fixed platen 140. The first fixed platen 140 is provided with a slide core 141 that pushes the outer peripheral edge 40e of the decorative sheet 40 toward the inside of the cavity. The region of the slide core 141 entering the cavity will serve as a region in which the first molded portion 11d is formed. The touch sensor sheet 50 and the FPC 51 are also set in the clamped movable platen 130. The movable platen 130 is provided with an ejector pin 131, a slide core 132 and a slide core 133 for storing the FPC.

Figure 9E:
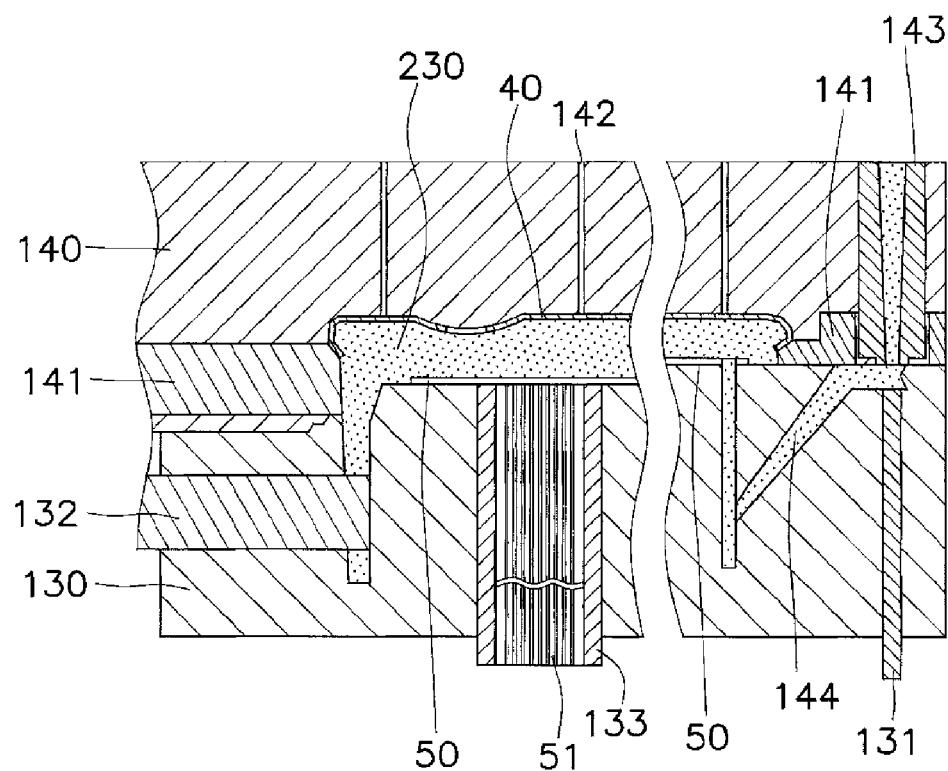
FIG. 9E is a cross-sectional view illustrating an injection process for the second molded portion according to Modification Example 2A.

FIG. 9E illustrates a state in which a molten resin 230 for molding the second molded portion 11c has been injected. The molten resin 230 is injected through a sprue 143 and a runner 144 into a cavity between the movable platen 130 and the first fixed platen 140. The decorative sheet 40 is softened by heat of the molten resin 230 and deformed by pressure of the molten resin 230 to conform to the shape of the slide core 132.

When the molten resin 230 cools and solidifies thereby forming the second molded portion 11c, the slide cores 132 and 141 slide out of the movable platen 130 and the first fixed platen 140, and the movable platen 130 and the first fixed platen 140 are opened. Then, the movable platen 130 rotates and moves to a second fixed platen 150 and the movable platen 130 and the second fixed platen 150 are clamped together.

Figure 9F:
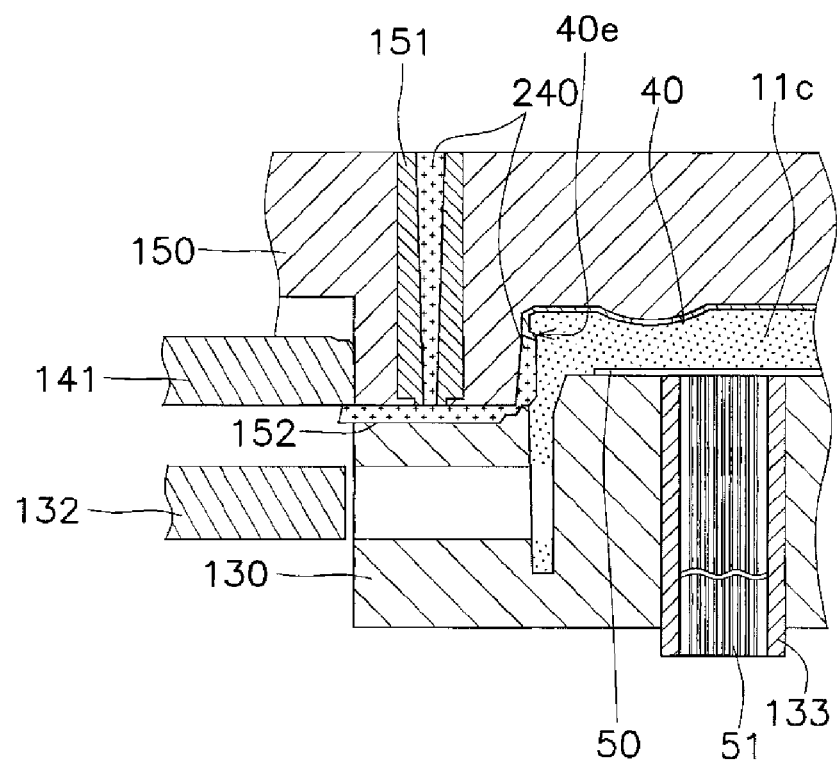
FIG. 9F is a cross-sectional view illustrating an injection process for a first molded portion according to Modification Example 2A.

FIG. 9F illustrates a state where a molten resin 240 is injected into a cavity between the movable platen 130 and the second fixed platen 150 that are clamped together. The molten resin 240 is injected through a sprue 151 and a runner 152 into the cavity between the movable platen 130 and the second fixed platen 150. The molten resin 240 cools and solidifies, thereby forming the shade structure 12 (see FIG. 9C) by the first molded portion 11d. This shade structure 12 can prevent light from leaking from around the outer peripheral edge 40e of the decorative sheet 40. Note that the second molded portion 11c is exposed on the side surfaces of the molded article 10C below the shade structure 12. Therefore, light leaks from the exposed second molded portion 11c. However, this molded article 10C has a structure in which a part of the shade structure 12 and the exposed second molded portion 11c are housed in the apparatus and light that leaks from the exposed portion of the second molded portion 11c does not leak outside the apparatus. Therefore, when light does not leak to reach the location of the shade structure 12, the problem of light leakage is eliminated.

FIGS. 9A to 9F illustrate only a case where the first molded portion 11d forms the shade structure 12, but the first molded portion 11d may form a structure of the molded article body 11 other than the shade structure 12, and moreover may form another molded portion by using another fixed platen.

Third Embodiment (8) Overall Configuration

In the first and second embodiments described above, a case in which the rib 14, 14B is disposed around the outer peripheral edge 40e of the decorative sheet 40 is described. However, in a molded article 10D according to a third embodiment illustrated in FIG. 10A, in place of the rib 14, 14B, a colored region 20, in which the light-transmitting resin is colored with ink, is disposed around the outer peripheral edge 40e of a decorative sheet 40A. The molded article 10D according to the third embodiment and the molded articles 10 and 10B according to the first and second embodiments differ from each other mainly in the shade structure 12, hence, other than this structure, components of identical structures are assigned with the same reference signs, and descriptions of those components are omitted.

Figure 10B:
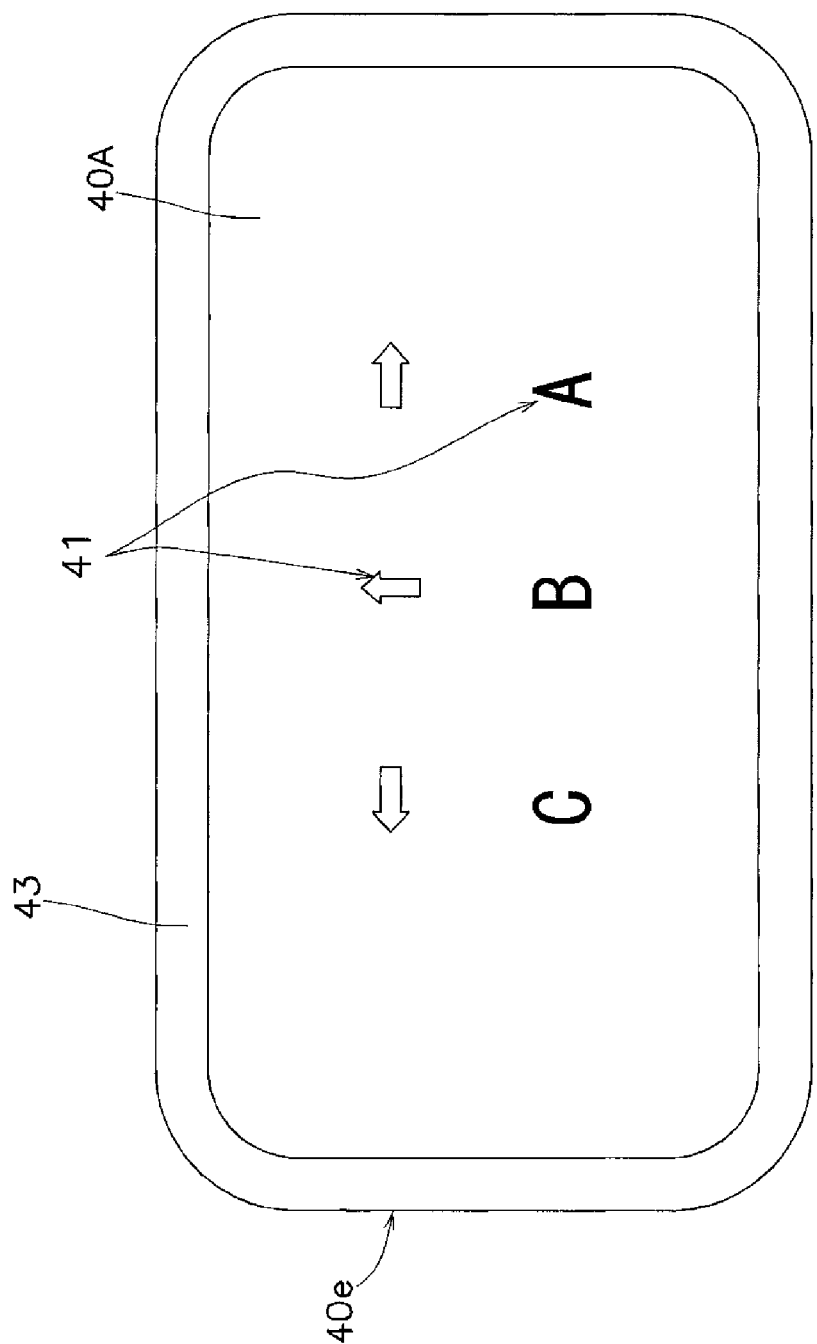
FIG. 10B is a rear view of a decorative sheet used to manufacture the molded article in FIG. 10A.

As illustrated in FIG. 10A, the shade structure 12 according to the third embodiment is the colored region 20 disposed between the parting line PL of the first molded portion 11a and the outer peripheral edge 40e of the decorative sheet 40A. Here, the colored region 20 is provided along the entire periphery of the outer peripheral edge 40e of the decorative sheet 40A. FIG. 10B illustrates the decorative sheet 40A when viewed from the rear. Ink 43 is printed along the entire outer peripheral edge 40e to form the colored region 20. This ink 43 is different from ink used in a picture layer that does not melt by injection molding and is easily melted by a molten resin used in injection molding. The ink 43 can be obtained, for example, by using a resin, which has a lower melting point than the ink used in the picture layer, as a binder resin for ink. The ink 43 is preferably printed thick by, for example, screen printing that is performed multiple times. The thickness of the ink 43 is, for example, from 5 μm to 30 μm, preferably from 7 μm to 20 μm. The colored region 20 is a region in which the melted ink 43 mixes with the light-transmitting resin forming the second molded portion 11b. The colored region 20 is located in the gap In (see FIG. 10D) between the parting line PL of the second molded portion 11b and the decorative sheet 40A, and/or covers the gap In thereby blocking the light Li traveling from the second molded portion 11b to outside the molded article 10D.

(9) Method for Manufacturing Molded Article 10D

Figure 10C:
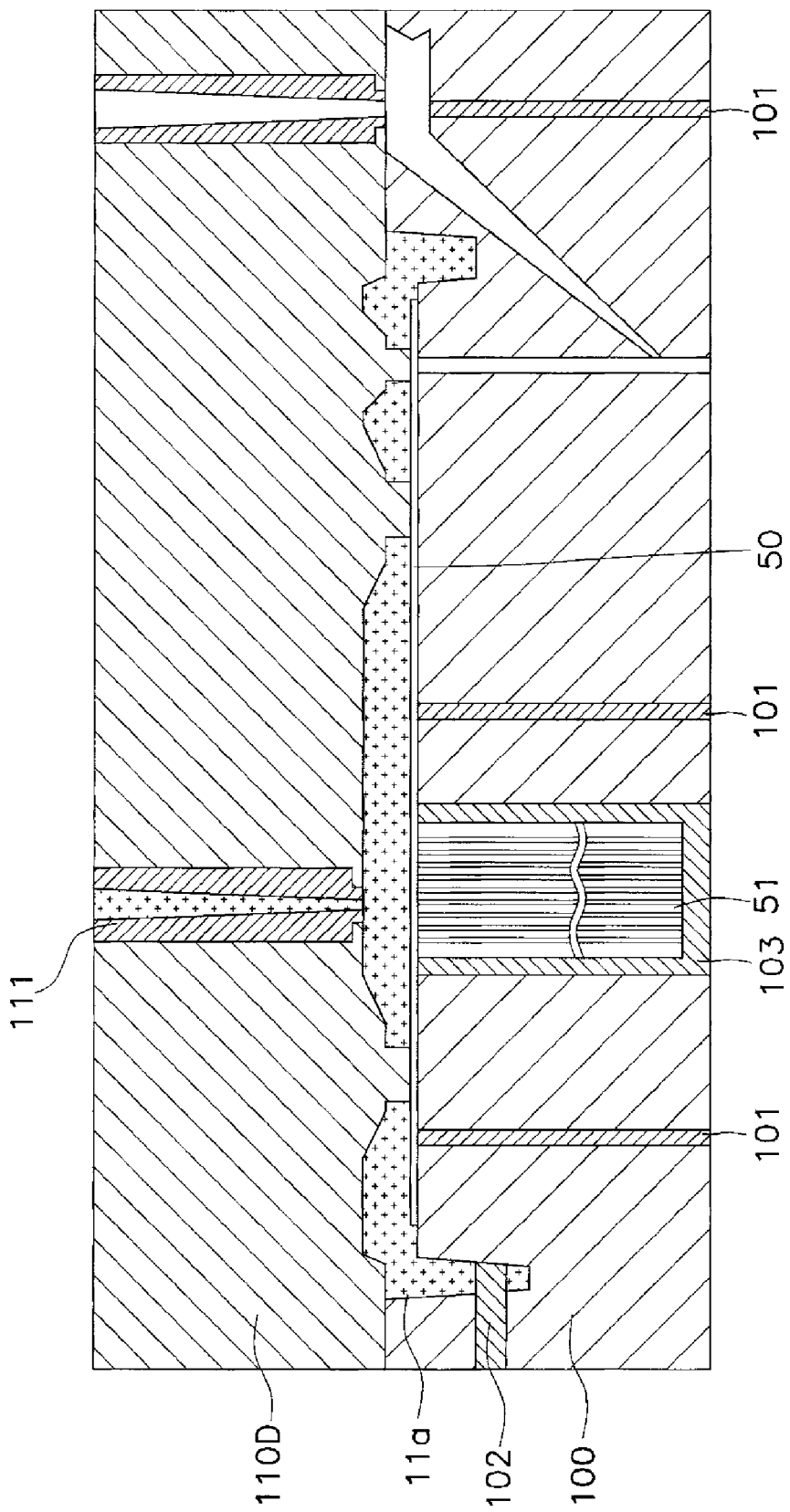
FIG. 10C is a cross-sectional view illustrating an injection process for a first molded portion according to a third embodiment.

A method for manufacturing the molded article 10D is described with reference to FIGS. 10C to 10E. FIG. 10C illustrates a state in which the movable platen 100 is clamped into a first fixed platen 110D thereby forming the first molded portion 11a. The first fixed platen 110D according to the third embodiment differs from the first fixed platens 110 and 110D according to the first and second embodiments in terms of presence or absence of the structure for forming the rib 14, 14B. In other words, no structure for forming a rib is present in the first fixed platen 110 according to the third embodiment. Manufacturing steps are the same as those in the first embodiment except for using a different mold, and the molten resin cools and solidifies in the cavity between the movable platen 100 and the first fixed platen 110D thereby forming the first molded portion 11a.

When molding of the first molded portion 11a is complete, the mold is opened from the state illustrated in FIG. 10C, with the first molded portion 11a remaining fixed to the movable platen 100. Then, the movable platen 100 rotates, for example, and moves to the front of the second fixed platen 120.

Figure 10D:
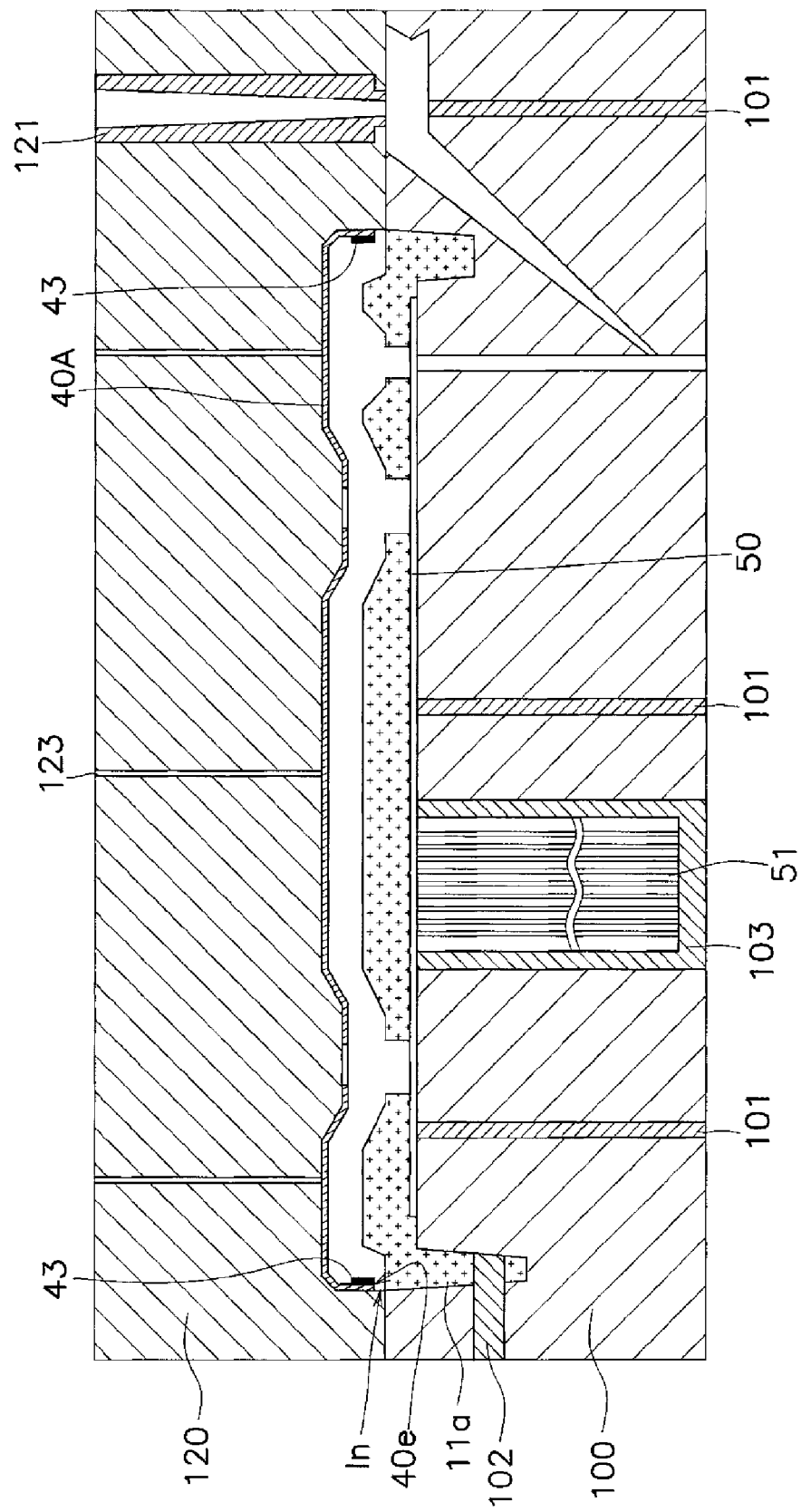
FIG. 10D is a cross-sectional view illustrating a clamping process for manufacturing a second molded portion according to the third embodiment.

FIG. 10D illustrates a state in which the movable platen 100 is clamped into the second fixed platen 120. The decorative sheet 40A is set in the second fixed platen 120. The formed decorative sheet 40A is suctioned by air through, for example, the suction hole 123 and adsorbed to the inner surface of the second fixed platen 120.

Figure 10E:
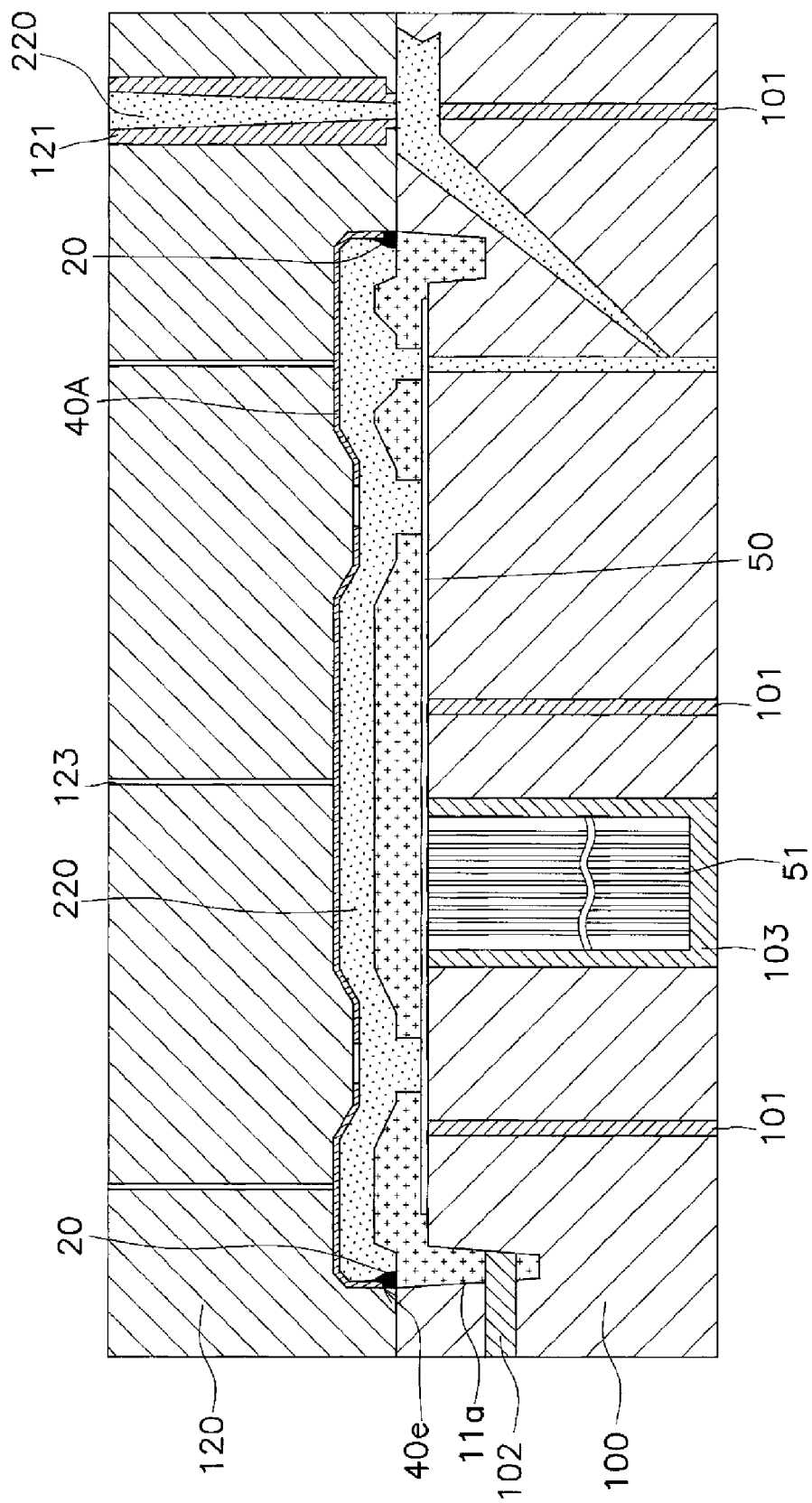
FIG. 10E is a cross-sectional view illustrating an injection process for the second molded portion according to the third embodiment.

FIG. 10E illustrates a state in which the molten resin 220 for molding the second molded portion 11b has been injected. The molten resin 220 is injected through the sprue 121 and the runner 122 into the cavity between the movable platen 100 and the second fixed platen 120. The ink 43 for the decorative sheet 40A is melted by heat of the molten resin 220 and mixes with the molten resin due to the flow of the molten resin 220 thereby forming the colored region 20. This colored region 20 serves as the shade structure 12. By providing the shade structure 12, the light Li that is irradiated from the LED 80 (see FIG. 2) and passes through the second molded portion 11b made of a light-transmitting resin can be suppressed from leaking near the outer peripheral edge 40e of the decorative sheet 40A, in particular from the gap between the outer peripheral edge 40e and the parting line PL of the first molded portion 11a, due to, for instance, refraction or reflection.

When the molten resin 220 cools and solidifies to form the second molded portion 11b, the slide cores 102 and 103 slide out of the first molded portion 11a, and the second fixed platen 120 and the movable platen 1100 open. FIG. 10A illustrates the molded article 10D when removed from the movable platen 100 by the ejector pins 101. As illustrated in FIG. 10A, the resin introduction hole 52 for injecting the molten resin 220 described above is formed in the touch sensor sheet 50.

(10) Characteristics

10-1

In the molded articles 10 and 10A to 10D according to the first to third embodiments described above, the decorative sheet 40, 40A and the touch sensor sheet 50, 50A are integrally molded with the molded article body 11 by insert molding. Around the outer peripheral edge 40e of the decorative sheet 40, 40A where the light Li emitted from the LED 80 illustrated in FIG. 2 is not to leak, the light Li passing through the second molded portion 11b, 11c made of a light-transmitting resin is suppressed by the shade structure 12, and leakage of the light Li is suppressed. As a result, the display of an illustration on the decorative sheet 40, 40A can be remarkably accentuated by the light Li emitted from the display portion 41.

10-2

When the shade structure 12 is provided in or around the gap In between the parting line PL of the second molded portion 11b, 11c and the outer peripheral edge 40e of the decorative sheet 40, 40A, this gap can prevent the occurrence of defects, such as wrinkling of the decorative sheet 40, 40A, which is caused by the outer peripheral edge 40e of the decorative sheet 40A contacting with the parting surface of the mold, hence, an aesthetically pleasing finishing touch can be provided to the decorative sheet 40, 40A.

10-3

In the molded article body 11, the second molded portion 11b, 11c below the display portion 41 is sandwiched between the decorative sheet 40, 40A and the touch sensor sheet 50, 50A and filled with light-transmitting resin. In other words, the second molded portion 11b, 11c below the display portion 41 is a partial region filled with light-transmitting resin. The resin introduction hole 52 in the touch sensor sheet 50, 50A is continuous with this partial region. By providing such a structure, an optical path of the light Li irradiated from the LED 80 can be seamlessly connected to the display portion 41 using the touch sensor sheet 50, 50A and the light-transmitting resin. As a result, light can be efficiently emitted from the display portion 41.

Note that in the first to third embodiments, a case is described in which the resin introduction hole 52 is provided in the touch sensor sheet 50, 50A, but the resin introduction hole may be provided in the decorative sheet 40, 40A and a similar effect is achieved when such a configuration is adopted.

10-4

With regard to the shade structure 12 according the first and second embodiments, the rib 14, 14A, 14B erected to a position higher than the outer peripheral edge 40e of the decorative sheet 40, 40A on the peripheral edge portion 13 of the first molded portion 11a is described. When the shade structure 12 is provided, these ribs 14, 14A, 14B can suppress the light Li passing through the second molded portion 11b. Further, when the ribs 14, 14A, 14B have light blocking properties, light blocking properties can be imparted to the shade structure 12.

10-5

In the first embodiment, the rib 14, 14A is described, with the rib 14, 14A being inclined toward a certain direction, in which the gap In is present, and contacting with the decorative sheet 40, 40A around the peripheral edge of the gap In. In the shade structure 12, the light Li is less likely to leak from a location where the decorative sheet 40, 40A and the rib 14, 14A are in contact, hence, due to contact between the decorative sheet 40, 40A and the rib 14, it is possible to achieve a sufficient light leakage suppression effect with the shade structure 12.

10-6

In the third embodiment, the shade structure 12 is a colored region 20 formed by mixing ink into the light-transmitting resin in or around the gap In. As illustrated in FIG. 10B, this colored region 20 is formed by the ink 43 printed on the outer peripheral edge 40e of the decorative sheet 40. A method of insert molding may be performed as in the prior art. In some cases, this colored region 20 cannot completely block light. However, because the light Li leaking at the outer peripheral edge 40e intrinsically far from the LED 80 is weak, the method of using the colored region 20 as the shade structure 12 is an inexpensive and convenient method that is effective in a case where it suffices as long as light leakage is suppressed.

10-7

The shade structure 12 may be the band-shaped first molded portion 11d described in Modification Example 2A of the second embodiment. The band-shaped first molded portion 11d is made of an opaque resin having a lower light transmittance than the second molded portion 11c made of a light-transmitting resin, and is embedded in the gap between the parting line PL and the outer peripheral edge 40e of the decorative sheet 40. Therefore, the light Li irradiated from the LED 80 and passed through the second molded portion 11c made of a light-transmitting resin is attenuated by the band-shaped first molded portion 11d made of an opaque resin having low light transmittance. When the first molded portion 11d is provided with light blocking properties, the shade structure 12 can block the light Li.

(11) Other Embodiments

The first to third embodiments of the present disclosure have been described above, but the present disclosure is not limited to the above-described embodiments, and various modifications can be made without departing from the gist of the disclosure. In particular, the plurality of embodiments and modified examples, which are described in the present specification, can be freely combined with one another.

11-1

For example, the decorative sheet is insert-molded by using primary molding thereby forming an intermediate molded article in which the outer peripheral edge of the decorative sheet protrudes from the primary molded article. Then, in secondary molding, opaque resin is injected to cover the resin molded portion of the intermediate molded article, formed in the primary molding, and the outer peripheral edge portion of the decorative sheet. Note that a touch switch is insert-molded in the secondary molding. A method for manufacturing this kind of molded article is also conceivable.

(12) Remarks 12-1

In the embodiments described above, a method for manufacturing a molded article such as a method below has been described.

That is, there is provided a method for manufacturing a molded article formed by integrally molding a molded article body including a first molded portion and a second molded portion, the second molded portion being made of a light-transmitting resin transmitting light guided to the display portion, and the first molded portion being made of an opaque resin having a lower light transmittance than the second molded portion; a decorative sheet including a decorative portion that embellishes the display portion; and a light-transmitting touch sensor sheet transmitting light that passes through the display portion, the method including forming a shade structure for suppressing the light that passes through the light-transmitting resin at least partly around an outer peripheral edge of the decorative sheet in the molded article body when insert-molding the molded article body and the decorative sheet.

12-2

More specifically, a method for manufacturing a molded article such as a method below has been described.

That is, in the method for manufacturing a molded article according to (12-1) described above, before insert molding, a rib is formed that is erected to a position higher than the outer peripheral edge of the decorative sheet on a peripheral edge portion of the first molded portion, and, during insert molding, molten resin causes the rib to come into contact with the decorative sheet thereby forming the shade structure.

12-3

Also a method for manufacturing a molded article in which, in the method for manufacturing a molded article according to (12-1) described above, a decorative sheet, on which ink is printed near the outer peripheral edge of the decorative sheet, is prepared before insert molding and, during insert molding, a colored region, formed by mixing the ink with the light-transmitting resin forming the second molded portion, is formed as the shade structure.

12-4

Also a method for manufacturing a molded article in which, in the method for manufacturing a molded article according to (12-1) described above, a band-shaped cavity is formed by slide cores near the outer peripheral edge of the decorative sheet during insert molding and, after insert molding, the band-shaped first molded portion is formed by injecting an opaque resin into the cavity.

REFERENCE CHARACTERS LIST

1 Display device
10, 10A to 10D Molded article
11 Molded article body
11a, 11d First molded portion
11b, 11c Second molded portion
12 Shade structure
14, 14A, 14B Rib
20 Colored region
40, 40A Decorative sheet
40e Outer peripheral edge
41 Display portion
42 Decorative portion
43 Ink
50, 50A Touch sensor sheet
51 FPC

The invention claimed is:

1. A molded article with a display portion through which light can pass, the molded article comprising:
 a molded article body including a first molded portion and a second molded portion, the second molded portion being made of a light-transmitting resin transmitting light guided to the display portion, the first molded portion being made of an opaque resin having a lower light transmittance than the second molded portion, and the first and second molded portions being injection molded;
 a decorative sheet integrally molded with the molded article body and including a decorative portion that embellishes the display portion; and
 a light-transmitting touch sensor sheet integrally molded with the molded article body and transmitting light that passes through the display portion,
 the molded article body further including a shade structure that is disposed at least partly around an outer peripheral edge of the decorative sheet and suppresses the light passing through the light-transmitting resin.

2. The molded article according to claim 1, wherein the shade structure is provided in or around a gap between a parting line of the second molded portion and the outer peripheral edge of the decorative sheet.

3. The molded article according to claim 2, wherein
 the molded article body includes a partial region, where the second molded portion is sandwiched between the decorative sheet and the touch sensor sheet, and filled with a light-transmitting resin; and
 at least one of the decorative sheet and the touch sensor sheet includes a resin introduction hole that is continuous with the partial region due to the light-transmitting resin.

4. The molded article according to claim 3, wherein the shade structure is a rib that is erected to a position higher than the outer peripheral edge of the decorative sheet on a peripheral edge portion of the first molded portion.

5. The molded article according to claim 4, wherein the rib is inclined toward a direction, in which the gap is present, and is in contact with the decorative sheet on a peripheral edge of the gap.

6. The molded article according to claim 2, wherein the shade structure is a rib that is erected to a position higher than the outer peripheral edge of the decorative sheet on a peripheral edge portion of the first molded portion.

7. The molded article according to claim 6, wherein the rib is inclined toward a direction in which the gap is present, and is in contact with the decorative sheet on a peripheral edge of the gap.

8. The molded article according to claim 2, wherein the shade structure is formed by mixing ink with the light-transmitting resin in or around the gap.

9. The molded article according to claim 2, wherein the shade structure is the first molded portion formed into a band shape and embedded into the gap.

10. A display device comprising:
 the molded article described in claim 1;
 a control device connected to the touch sensor sheet; and a light emitting element controlled by the control device to irradiate light to the molded article.

11. A method for manufacturing a molded article formed by integrally molding: a molded article body including a first molded portion and a second molded portion, the second molded portion being made of a light-transmitting resin transmitting light guided to the display portion, the first molded portion being made of an opaque resin having a lower light transmittance than the second molded portion, and the first and second molded portions being injection molded; a decorative sheet including a decorative portion that embellishes the display portion; and a light-transmitting touch sensor sheet transmitting light that passes through the display portion, the method comprising forming a shade structure for suppressing the light that passes through the light-transmitting resin at least partly around an outer peripheral edge of the decorative sheet in the molded article body when insert-molding the molded article body and the decorative sheet.

* * * * *